(12) United States Patent
Mehandru et al.

(10) Patent No.: US 10,790,281 B2
(45) Date of Patent: Sep. 29, 2020

(54) STACKED CHANNEL STRUCTURES FOR MOSFETS

(71) Applicant: Intel Corporation, Santa Clara, CA (US)

(72) Inventors: Rishabh Mehandru, Portland, OR (US); Roza Kotlyar, Portland, OR (US); Stephen M. Cea, Hillsboro, OR (US); Patrick H. Keys, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,325

(22) PCT Filed: Dec. 3, 2015

(86) PCT No.: PCT/US2015/063613
§ 371 (c)(1),
(2) Date: May 3, 2018

(87) PCT Pub. No.: WO2017/095409
PCT Pub. Date: Jun. 8, 2017

(65) Prior Publication Data
US 2018/0323195 A1  Nov. 8, 2018

(51) Int. Cl.
*H01L 27/092* (2006.01)
*H01L 21/8238* (2006.01)
(Continued)

(52) U.S. Cl.
CPC ...... *H01L 27/0924* (2013.01); *H01L 21/8221* (2013.01); *H01L 21/823807* (2013.01);
(Continued)

(58) Field of Classification Search
CPC ............ H01L 21/845; H01L 27/1211; H01L 29/66795; H01L 29/785
See application file for complete search history.

(56) References Cited

U.S. PATENT DOCUMENTS

2005/0158934 A1*  7/2005  Yun ............... H01L 21/823437
                                                           438/197
2007/0069280 A1*  3/2007  Kim .................... H01L 21/845
                                                           257/315
(Continued)

FOREIGN PATENT DOCUMENTS

KR   100645065 B1   11/2006
WO   2015047341 A1   4/2015
(Continued)

OTHER PUBLICATIONS

International Search Report and Written Opinion issued in PCT Application No. PCT/US2015/063613 dated Aug. 8, 2016; 10 pages.
(Continued)

*Primary Examiner* — Ermias T Woldegeorgis
(74) *Attorney, Agent, or Firm* — Patent Capital Group

(57) ABSTRACT

Disclosed herein are stacked channel structures for metal oxide semiconductor field effect transistors (MOSFETs) and related circuit elements, computing devices, and methods. For example, a stacked channel structure may include: a semiconductor substrate having a substrate lattice constant; a fin extending away from the semiconductor substrate, the fin having an upper region and a lower region; a first transistor in the lower region, wherein the first transistor has a first channel, the first channel has a first lattice constant, and the first lattice constant is different from the substrate lattice constant; and a second transistor in the upper region, wherein the second transistor has a second channel, the
(Continued)

second channel has a second lattice constant, and the second lattice constant is different from the substrate lattice constant.

25 Claims, 26 Drawing Sheets

(51) Int. Cl.
| | |
|---|---|
| *H01L 29/10* | (2006.01) |
| *H01L 27/06* | (2006.01) |
| *H01L 29/78* | (2006.01) |
| *H01L 21/822* | (2006.01) |
| *H01L 27/12* | (2006.01) |
| *H01L 21/84* | (2006.01) |
| *H01L 29/66* | (2006.01) |

(52) U.S. Cl.
CPC .... *H01L 21/823821* (2013.01); *H01L 21/845* (2013.01); *H01L 27/0688* (2013.01); *H01L 27/092* (2013.01); *H01L 27/0922* (2013.01); *H01L 27/1211* (2013.01); *H01L 29/1054* (2013.01); *H01L 29/66666* (2013.01); *H01L 29/78* (2013.01)

(56) References Cited

U.S. PATENT DOCUMENTS

| | | |
|---|---|---|
| 2012/0126883 A1 | 5/2012 | Juengling |
| 2014/0035041 A1* | 2/2014 | Pillarisetty ............ H01L 21/845 257/365 |
| 2015/0144880 A1 | 5/2015 | Rachmady et al. |

FOREIGN PATENT DOCUMENTS

| | | |
|---|---|---|
| WO | 2016204755 A1 | 12/2016 |
| WO | 2017095409 A1 | 6/2017 |

OTHER PUBLICATIONS

P. Packan et al., "High performance Hi-K + metal gate strain enhanced transistors on (110) silicon," 2008 IEEE International Electron Devices Meeting, San Francisco, CA, 2008, pp. 1-4.

* cited by examiner

2100

```
┌─────────────────────────────────────────────────────────┐
│ PROVIDE A SEMICONDUCTOR SUBSTRATE HAVING A SUBSTRATE    │
│                    LATTICE CONSTANT                      │
│                         2102                             │
└─────────────────────────────────────────────────────────┘
                            ▼
┌─────────────────────────────────────────────────────────┐
│       PROVIDE A FIRST INTERMEDIATE LAYER ON THE          │
│              SEMICONDUCTOR SUBSTRATE                     │
│                         2104                             │
└─────────────────────────────────────────────────────────┘
                            ▼
┌─────────────────────────────────────────────────────────┐
│    PROVIDE A FIRST CHANNEL MATERIAL ON THE FIRST         │
│  INTERMEDIATE LAYER, THE FIRST CHANNEL MATERIAL HAVING A │
│   FIRST LATTICE CONSTANT DIFFERENT FROM THE SUBSTRATE    │
│                    LATTICE CONSTANT                      │
│                         2106                             │
└─────────────────────────────────────────────────────────┘
                            ▼
┌─────────────────────────────────────────────────────────┐
│     PROVIDE A SECOND INTERMEDIATE LAYER ON THE FIRST     │
│                   CHANNEL MATERIAL                       │
│                         2108                             │
└─────────────────────────────────────────────────────────┘
                            ▼
┌─────────────────────────────────────────────────────────┐
│   PROVIDE A SECOND CHANNEL MATERIAL ON THE SECOND        │
│  INTERMEDIATE LAYER, THE SECOND CHANNEL MATERIAL HAVING  │
│  A SECOND LATTICE CONSTANT DIFFERENT FROM THE SUBSTRATE  │
│                    LATTICE CONSTANT                      │
│                         2110                             │
└─────────────────────────────────────────────────────────┘
                            ▼
┌─────────────────────────────────────────────────────────┐
│    FORM A FIN EXTENDING AWAY FROM THE SEMICONDUCTOR      │
│     SUBSTRATE, WHEREIN THE FIRST CHANNEL MATERIAL IS     │
│   DISPOSED IN A LOWER REGION OF THE FIN AND THE SECOND   │
│   CHANNEL MATERIAL IS DISPOSED IN AN UPPER REGION OF THE │
│                           FIN                            │
│                         2112                             │
└─────────────────────────────────────────────────────────┘
```

FIG. 21

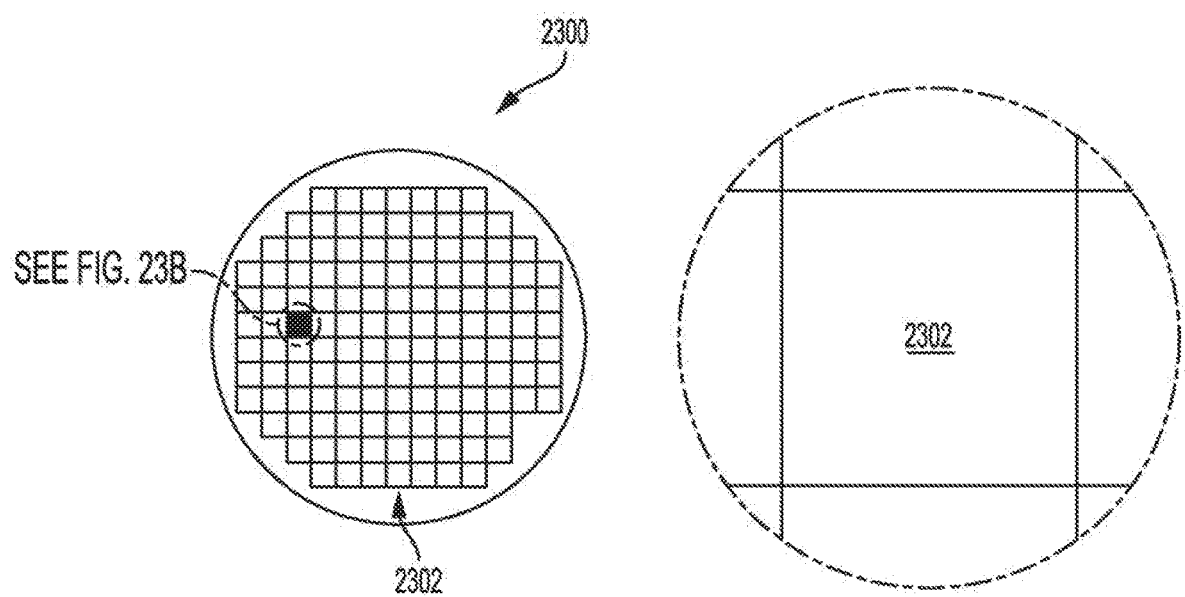
FIG. 23A   FIG. 23B
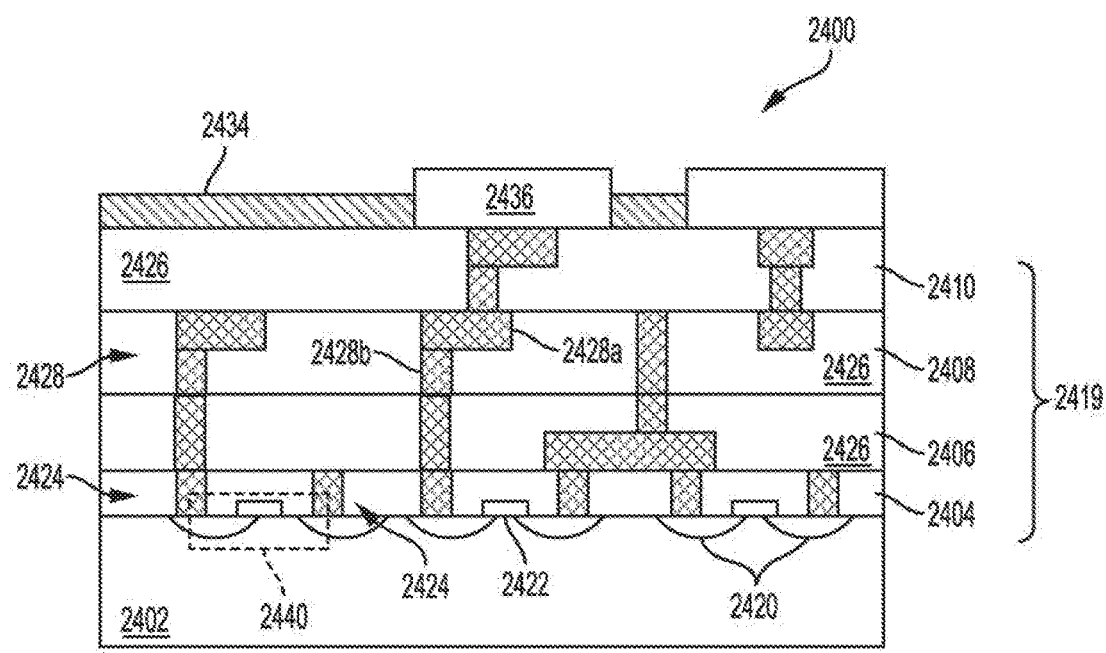
FIG. 24

STACKED CHANNEL STRUCTURES FOR MOSFETS

CROSS-REFERENCE TO RELATED APPLICATION

This application is a national stage application under 35 U.S.C. § 371 of PCT International Application Serial No. PCT/US2015/063613, filed on Dec. 3, 2015 and entitled "STACKED CHANNEL STRUCTURES FOR MOSFETS," which is hereby incorporated by reference herein in its entirety.

TECHNICAL FIELD

The present disclosure relates generally to the field of metal oxide semiconductor field effect transistors (MOSFETs), and more particularly, to stacked channel structures for MOSFETs.

BACKGROUND

The mobility of the electrons or holes in the channel of a metal oxide semiconductor field effect transistor (MOSFET) may affect the performance of the device. Mobility may in turn be affected by the mechanical strain experienced by the channel material. Some transistors may include extra "stressor regions" laterally around a transistor channel to cause compression or tension of the channel in an attempt to improve device performance.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 21 is a flow diagram of a method of manufacturing a stacked channel structure, in accordance with various embodiments.

FIGS. 23A and 23B are top views of a wafer and dies that may include a stacked channel structure in accordance with any of the embodiments disclosed herein.

FIG. 24 is a cross-sectional side view of an IC device that may include the stacked channel structure of FIG. 1, in accordance with various embodiments.

DETAILED DESCRIPTION

Figures 1A, 1B:
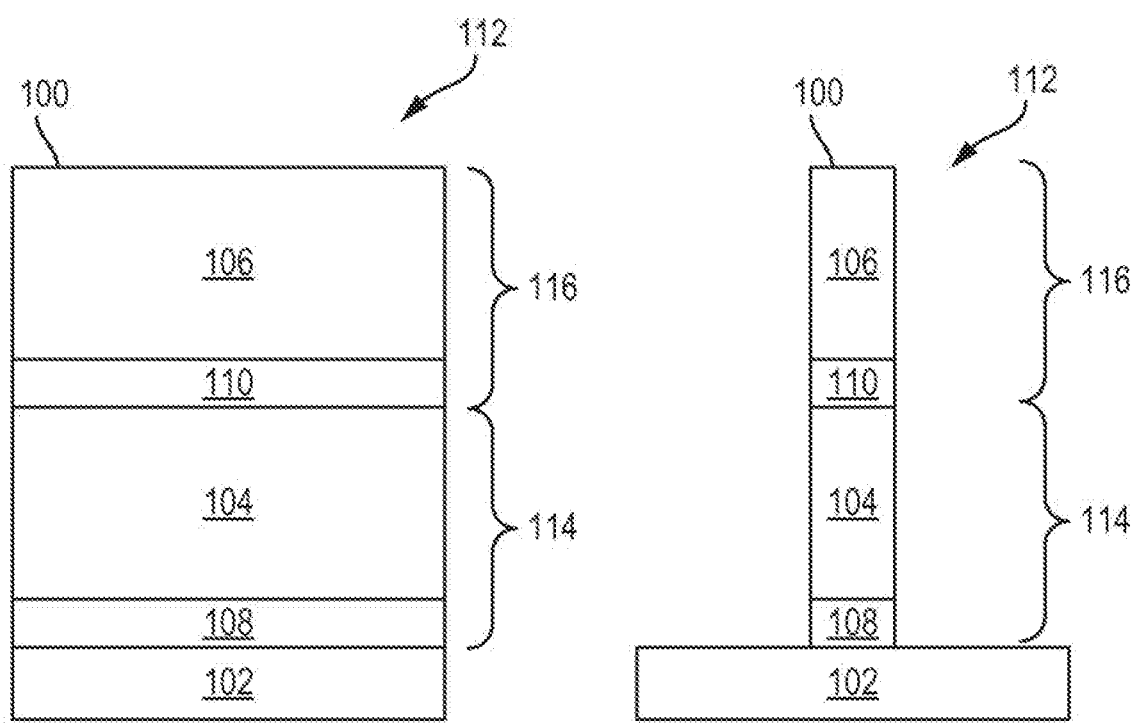
FIGS. 1A and 1B are cross-sectional views of a stacked channel structure, in accordance with various embodiments.

Disclosed herein are stacked channel structures for metal oxide semiconductor field effect transistors (MOSFETs) and related circuit elements, computing devices, and methods. For example, a stacked channel structure may include: a semiconductor substrate having a substrate lattice constant; a fin extending away from the semiconductor substrate, the fin having an upper region and a lower region; a first transistor in the lower region, wherein the first transistor has a first channel, the first channel has a first lattice constant, and the first lattice constant is different from the substrate lattice constant; and a second transistor in the upper region, wherein the second transistor has a second channel, the second channel has a second lattice constant, and the second lattice constant is different from the substrate lattice constant. The lattice mismatches between materials in the stack may generate strain within the channels, which may improve mobility of electrons or holes as suitable in the channels and improve device performance.

In some embodiments, the strain generated by the vertical integration of materials with lattice mismatches may provide enough mobility enhancement to replace existing mobility enhancement techniques, like the use of lateral stressor regions around the channel of a PMOS device. This may save valuable volume in the device, while maintaining or exceeding performance.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). As used herein, the term "strain" may refer to compression or tension. As used herein, a "conductivity type" may refer to an n-type or a p-type. As used herein, the term "tensile" may refer to the state of being under tension, and the term "compressive" may refer to the state of being under compression.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale.

FIGS. 1A and 1B are cross-sectional views of a stacked channel structure 100 in a fin 112, in accordance with various embodiments. In particular, FIG. 1A is a cross-sectional view taken along the fin 112, and FIG. 1B is a cross-sectional view taken across the fin 112. The stacked channel structure 100 may include a semiconductor substrate 102 and a fin 112 extending away from the semiconductor substrate 102. The fin 112 may include an upper region 116 and a lower region 114. As illustrated in FIG. 1, the lower region 114 may be disposed between the upper region 116 and the semiconductor substrate 102.

A first channel 104 for a first transistor may be disposed in the lower region 114 of the fin 112. A second channel 106 for a second transistor may be disposed in the upper region 116 of the fin 112. As illustrated in FIG. 1, the first channel 104 may be disposed between the second channel 106 and the semiconductor substrate 102. The first and second transistors may further include source/drain (S/D) regions and gate; these are not illustrated in FIG. 1, but are illustrated and discussed below with reference to FIGS. 2-20, for example.

The semiconductor substrate 102 may have a lattice constant (referred to herein as the "substrate lattice constant"), the first channel 104 may have a lattice constant (referred to herein as the "first lattice constant"), and the second channel 106 may have a lattice constant (referred to herein as the "second lattice constant"). The first lattice constant and/or the second lattice constant may be different from the substrate lattice constant. As discussed in further detail below, the mismatch between lattice constants of materials in the stacked channel structure 100 (in particular, a mismatch between the substrate lattice constant and the first and/or second lattice constants) may impart strain to the channels, which may enhance mobility and improve the performance of the first and second transistors (relative to unstrained channels).

In some embodiments, the semiconductor substrate 102 may be formed of silicon. In some embodiments, the semiconductor substrate 102 may be formed of relaxed SiGe. In some embodiments, the semiconductor substrate 102 may be formed of indium gallium arsenide (InGaAs), indium arsenide (InP), indium phosphide (InP), gallium arsenide (GaAs), or aluminum gallium arsenide (AlGaAs). These examples are non-limiting, and any suitable semiconductor substrate material may be used for the semiconductor substrate 102.

A first insulator 108 may be disposed between the semiconductor substrate 102 and the first channel 104, and a second insulator 110 may be disposed between the first channel 104 and the second channel 106. The insulators 108 and 110 may provide electrical isolation between the semiconductor substrate 102 and the first channel 104, and between the first channel 104 and the second channel 106, respectively.

In some embodiments, the first insulator 108 may have a crystalline structure, and may be formed on the semiconductor substrate 102 (e.g., by epitaxy) so that the spacing between the atoms of the first insulator 108 approximately matches the spacing between the atoms of the semiconductor substrate 102. This "lattice matching" may occur when the lattice constant of the first insulator 108 is similar enough to the substrate lattice constant that the atoms of the first insulator 108 can move closer together or farther apart to approximately "match" the spacing of the atoms of the semiconductor substrate 102. In some embodiments, effective lattice matching may occur when the lattice constants of two adjacent materials are within 5% or less of each other, but this number may depend on the particular materials and geometry involved, as known in the art. An example of a material that may be included in the first insulator 108 is yttria stabilized zirconia (YSZ).

The movement of atoms of the first insulator 108 closer together or farther apart may generate strain within the first insulator 108. In particular, if the lattice constant of the first insulator 108 is less than the lattice constant of the semiconductor substrate 102 (i.e., the atoms of the first insulator 108 have to move apart to match the structure of the semiconductor substrate 102), the first insulator 108 may experience tension. If the lattice constant of the first insulator 108 is greater than the lattice constant of the semiconductor substrate 102 (i.e., the atoms of the first insulator 108 have to move closer together to match the structure of the semiconductor substrate 102), the first insulator 108 may experience compression.

If the thickness of the first insulator 108 (as measured between the semiconductor substrate 102 and the first channel 104) is greater than a critical thickness, the lattice matching that occurs at the interface between the first insulator 108 and the semiconductor substrate 102 may "relax" over the thickness of the first insulator 108, and the spacing at the interface between the first insulator 108 and the first channel 104 may be closer to the lattice constant of the first insulator 108. The thickness of the first insulator 108 (as measured between the semiconductor substrate 102 and the first channel 104) may be less than 20 nm (in some embodiments, between 5 and 10 nm). This thickness may be generally below the bulk critical thickness after which any lattice matching in the bulk may "relax," and thus the matching present at the interface between the semiconductor substrate 102 and the first insulator 108 may be maintained at the interface between the first insulator 108 and the first channel 104. The critical thickness of a material may itself depend on its geometry (e.g., the critical thickness may be larger when the material is grown in a confined trench), and different growth regimes (e.g., when a material is in a meta-stable state) may not be limited by the thermodynamics that lead to bulk critical thickness. Generally, critical thickness issues may not play a significant role in the stacked channel structures 100 disclosed herein, and thus are not discussed further.

When the spacing of the atoms in the semiconductor substrate 102 is substantially maintained at the interface between the first insulator 108 and the first channel 104 by lattice matching, as discussed above, the atoms of the first channel 104 may similarly move closer together or farther apart to match the spacing of the atoms in the semiconductor substrate 102 (as telegraphed to the first channel 104 via the first insulator 108). In particular, if the lattice constant of the first channel 104 is less than the lattice constant of the semiconductor substrate 102, the first channel 104 may experience tension. If the lattice constant of the first channel 104 is greater than the lattice constant of the semiconductor substrate 102, the first channel 104 may experience compression.

When the first channel 104 is a channel of an NMOS transistor, tensile strain may increase the electron mobility in the first channel 104, improving performance of the NMOS transistor. Thus, in embodiments in which the first transistor is an NMOS transistor, the first channel 104 may have a lattice constant that is less than the substrate lattice constant. In some such embodiments, when the semiconductor substrate 102 is formed of relaxed $Si_{1-x}Ge_x$, the first channel 104 may be formed of $Si_{1-y}Ge_y$, where y is less than x. For example, the semiconductor substrate 102 may be formed of relaxed SiGe, and the first channel 104 may be formed of silicon, achieving tension having a magnitude of 250 MPa or greater (e.g., 250-500 MPa, or greater than 500 MPa), in some embodiments. In another example, the semiconductor substrate 102 may be formed of $Ge_{1-x}Sn_x$, and the first channel 104 may be formed of $Ge_{1-y}Sn_y$, where y is less than x. In another example, the semiconductor substrate 102 may be formed of $Si_{1-x}Sn_x$, and the first channel 104 may be formed of $Si_{1-y}Sn_y$, wherein y is less than x.

When the first channel 104 is a channel of a PMOS transistor, compressive strain may increase the hole mobility in the first channel 104, improving performance of the PMOS transistor. Thus, in embodiments in which the first transistor is a PMOS transistor, the first channel 104 may have a lattice constant that is greater than the substrate lattice constant. In some such embodiments, when the semiconductor substrate 102 is formed of relaxed $Si_{1-x}Ge_x$, the first channel 104 may be formed of $Si_{1-y}Ge_y$, where y is greater than x. For example, the semiconductor substrate 102 may be formed of relaxed SiGe with a 20% germanium content, and the first channel 104 may be formed of SiGe with a germanium content greater than 20% (e.g., 40%), achieving compression having a magnitude of 250 MPa or greater (e.g., 250-500 MPa, or greater than 500 MPa) in some embodiments. In another example, the semiconductor substrate 102 may be formed of $Ge_{1-x}Sn_x$, and the first channel 104 may be formed of $Ge_{1-y}Sn_y$, where y is greater than x. In another example, the semiconductor substrate 102 may be formed of $Si_{1-x}Sn_x$, and the first channel 104 may be formed of $Si_{1-y}Sn_y$, wherein y is greater than x.

When the spacing of the atoms in the semiconductor substrate 102 is substantially maintained through the volume of the first channel 104 and to the interface between the first channel 104 and the second insulator 110, and the second insulator 110 itself has a crystalline structure that is capable of lattice matching the spacing (as discussed above with reference to the first insulator 108), the atoms of the second insulator 110 may similarly move closer together or farther apart to match the spacing of the atoms in the semiconductor substrate 102 (as telegraphed to the second insulator 110 via the first insulator 108 and the first channel 104). In particular, if the lattice constant of the second insulator 110 is less than the lattice constant of the semiconductor substrate 102, the second insulator 110 may experience tension. If the lattice constant of the second insulator 110 is greater than the lattice constant of the semiconductor substrate 102, the second insulator 110 may experience compression. The choice of materials for the second insulator 110 may take the form of any of the embodiments discussed herein with reference to the first insulator 108.

When the spacing of the atoms in the semiconductor substrate 102 is substantially maintained through the volume of the second insulator 110 and to the interface between the second insulator 110 and the second channel 106, the atoms of the second channel 106 may similarly move closer together or farther apart to match the spacing of the atoms in the semiconductor substrate 102 (as telegraphed to the second channel 106 via the first insulator 108, the first channel 104, and the second insulator 110). In particular, if the lattice constant of the second channel 106 is less than the lattice constant of the semiconductor substrate 102, the second channel 106 may experience tension. If the lattice constant of the second channel 106 is greater than the lattice constant of the semiconductor substrate 102, the second channel 106 may experience compression.

As discussed above with reference to the first channel 104, when the second channel 106 is a channel of an NMOS transistor, tensile strain may increase the electron mobility in the second channel 106, improving performance of the NMOS transistor. Thus, in embodiments in which the second transistor is an NMOS transistor, the second channel 106 may have a lattice constant that is less than the substrate lattice constant. Examples of materials that may be used for the semiconductor substrate 102 and the second channel 106 when the second transistor is an NMOS transistor include any of the examples discussed above for embodiments in which the first transistor (associated with the first channel 104) is an NMOS transistor.

As also discussed above with reference to the first channel 104, when the second channel 106 is a channel of a PMOS transistor, compressive strain may increase the hole mobility in the second channel 106, improving performance of the PMOS transistor. Thus, in embodiments in which the second transistor is a PMOS transistor, the second channel 106 may have a lattice constant that is greater than the substrate lattice constant. Examples of materials that may be used for the semiconductor substrate 102 and the second channel 106 when the second transistor is a PMOS transistor include any of the examples discussed above for embodiments in which the first transistor (associated with the first channel 104) is a PMOS transistor.

In some embodiments, the first transistor (associated with the first channel 104) and the second transistor (associated with the second channel 106) may have different conductivity types. For example, in embodiments in which the first transistor is a PMOS transistor and the second transistor is an NMOS transistor, the first lattice constant may be greater than the substrate lattice constant, and the second lattice constant may be less than the substrate lattice constant. In some such embodiments, the first channel 104 may include $Si_{1-x}Ge_x$, and the second channel 106 may include $Si_{1-y}Ge_y$, where x is greater than y. For example, the semiconductor substrate 102 may be formed of relaxed SiGe (e.g., with a 20% Ge content), the first channel 104 may be formed of SiGe (e.g., with a 40% Ge content), and the second channel 106 may be formed of silicon. In another example, the first channel 104 may be formed of $Ge_{1-x}Sn_x$, and the second channel 106 may be formed of $Ge_{1-y}Sn_y$, where y is less than x. In another example, the first channel 104 may be formed of $Si_{1-x}Sn_x$, and the second channel 106 may be formed of $Si_{1-y}Sn_y$, wherein y is less than x.

In embodiments in which the first transistor is an NMOS transistor and the second transistor is a PMOS transistor, the first lattice constant may be less than the substrate lattice constant, and the second lattice constant may be greater than the substrate lattice constant. In some such embodiments, the first channel 104 may include $Si_{1-x}Ge_x$, and the second channel 106 may include $Si_{1-y}Ge_y$, where x is less than y. For example, the semiconductor substrate 102 may be formed of relaxed SiGe (e.g., with a 20% Ge content), the second channel 106 may be formed of SiGe (e.g., with a 40% Ge content), and the first channel 104 may be formed of silicon. In another example, the first channel 104 may be formed of $Ge_{1-x}Sn_x$, and the second channel 106 may be formed of $Ge_{1-y}Sn_y$, where y is greater than x. In another example, the first channel 104 may be formed of $Si_{1-x}Sn_x$, and the second channel 106 may be formed of $Si_{1-y}Sn_y$, wherein y is greater than x.

In some embodiments, the first transistor (associated with the first channel 104) and second transistor (associated with the second channel 106) may have the same conductivity type. For example, in embodiments in which the first transistor is a PMOS transistor and the second transistor is a PMOS transistor, the first lattice constant may be greater than the substrate lattice constant, and the second lattice constant may be greater than the substrate lattice constant; suitable materials for the first channel 104 and the second channel 106 in such embodiments may take any of the forms discussed above. For example, the semiconductor substrate may be formed of relaxed SiGe (e.g., with a 20% Ge content), the first channel 104 may be formed of SiGe (e.g., with a 40% Ge content), and the second channel 106 may be formed of SiGe (e.g., with a 40% Ge content). In embodiments in which the first transistor is an NMOS transistor and the second transistor is an NMOS transistor, the first lattice constant may be less than the substrate lattice constant, and the second lattice constant may be less than the substrate lattice constant; suitable materials for the first channel 104 and the second channel 106 in such embodiments may take any of the forms discussed above. For example, the semiconductor substrate may be formed of relaxed SiGe (e.g., with a 20% Ge content), the first channel 104 may be formed of silicon, and the second channel 106 may be formed of silicon.

In some embodiments, the first insulator 108 and/or the second insulator 110 may include a nitride or oxide (e.g., silicon nitride or silicon oxide). These materials may have an amorphous, noncrystalline structure that is not itself suitable for telegraphing a lattice structure of one adjacent material to another adjacent material (as a crystalline material would, as discussed above). In such embodiments, to form a stacked channel structure 100 having lattice mismatches to induce desired strains in the first channel 104 and/or the second channel 106, the stacked channel structure 100 may be formed by utilizing a strained sacrificial epitaxial layer in the place of the first insulator 108 and/or the second insulator 110; a selected patch may remove the strained sacrificial epitaxial layer after the second channel 106 has been formed in accordance with the techniques discussed above, and the oxide or nitride may replace the removed sacrificial epitaxial layer.

For example, a strained sacrificial epitaxial layer of SiGe having a high germanium content (e.g., higher than the germanium content of any SiGe included in the first channel 104 and/or the second channel 106) may be used in place of the crystalline first insulator 108 and/or crystalline second insulator 110 as discussed above. The strained sacrificial epitaxial SiGe layers may telegraph the lattice structure of the semiconductor substrate 102 to the first channel 104 and/or the second channel 106 as discussed above with reference to the crystalline first insulator 108/second insulator 110, and thus desired strains may be achieved in the first channel 104 and/or the second channel 106. However, the strained sacrificial epitaxial SiGe layers may not provide the desired electrical isolation between the first channel 104 and the second channel 106. To achieve a desired isolation, the strained sacrificial epitaxial SiGe layers may be removed by selective etching and replaced with an oxide or nitride. The strained first channel 104 and second channel 106 formed using strained sacrificial epitaxial SiGe layers may maintain their strain even upon removal of the strained sacrificial epitaxial SiGe layers and introduction of the oxide or nitride isolation materials. Thus, a stacked channel structure 100 having the desired lattice mismatches may be achieved. Any of the stacked channel structures 100 discussed herein may be used with a crystalline insulator or an oxide/nitride insulator as the first insulator 108 and/or the second insulator 110.

FIGS. 2-8 illustrate various circuit elements including a stacked channel structure 100. Any suitable ones of the embodiments discussed above may be utilized in these circuit elements (e.g., any of the tensile channel arrangements for an NMOS channel and any of the compressive channel arrangements for a PMOS channel). In FIGS. 2-8, only a portion of the semiconductor substrate 102 and, in various ones of FIGS. 2-8, only a portion of the first insulator 108 is shown.

Figure 2A:
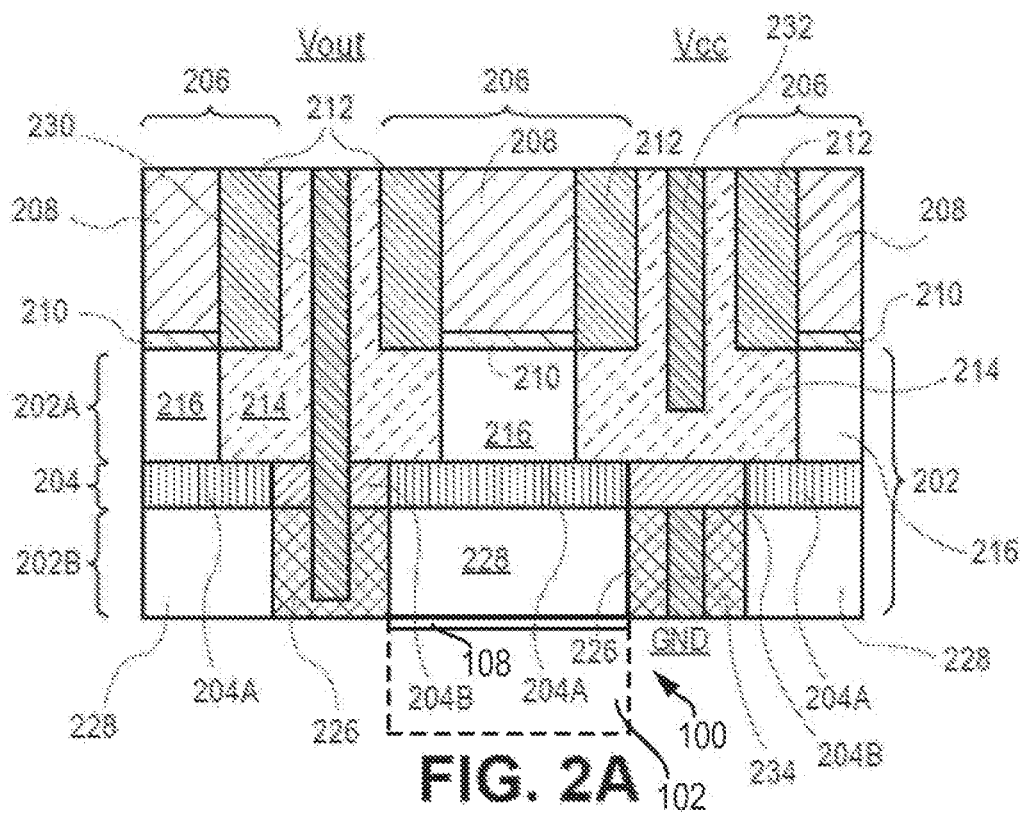
FIGS. 2A and 2B are cross-sectional views of an inverter circuit element fabricated using a single semiconductor fin structure and including the stacked channel structure of FIG. 1, in accordance with various embodiments.
Figure 2B:
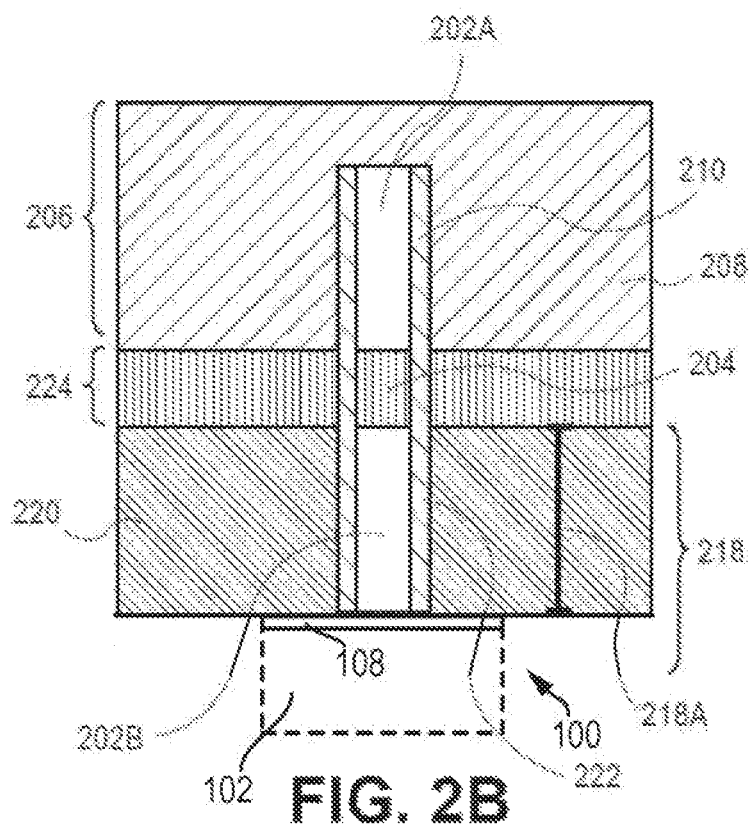

In a first example of a circuit element that may be fabricated using a single fin, FIGS. 2A and 2B are cross-sectional views of an inverter circuit element fabricated using a single semiconductor fin structure and including the stacked channel structure 100, in accordance with various embodiments. FIG. 2A is a cross-sectional view taken through the gate structures and along the fin structure. FIG. 2B is a cross-sectional view taken through the fin structure and along the gate structures.

Referring to FIG. 2A, a semiconductor fin 202 (e.g., the fin 112 of the stacked channel structure 100) can be viewed as being separated vertically into an upper region 202A and a lower region 202B (e.g., the upper region 116 and the lower region 114, respectively, of the stacked channel structure 100). In one embodiment, the upper region 202A and the lower region 202B of the semiconductor fin 202 are separated by an insulating layer 204, such as a silicon oxide layer or other insulating oxide layer or a silicon nitride layer.

The insulating layer 204 may include regions 204A and 204B of differing insulating material, depending on the integration scheme used to fabricate the structure, examples of which are described in greater detail below. For example, the region 204A may be the second insulator 110 of the stacked channel structure 100, and may be formed of an oxide, nitride, or crystalline insulator, as discussed above. The semiconductor fin 202 may extend away from the semiconductor substrate 102 of the stacked channel structure 100.

A first plurality of gate structures 206, such as PMOS gate structures, is included above the upper region 202A of the semiconductor fin 202. Each of the first plurality of gate structures 206 may include a gate electrode 208, a gate dielectric layer 210, and associated dielectric spacers 212. It is to be appreciated that the first plurality of gate structures 206 extends from the top of the upper region 202A of the semiconductor fin 202 (as shown) and further wraps the upper region 202A of the semiconductor fin 202 at locations into and out of the page with respect to the perspective shown in FIG. 2A. The upper region 202A of the semiconductor fin 202 may, in an embodiment, further include regrown source or drain regions. In the embodiment illustrated in FIG. 2A, the upper region 202A of the semiconductor fin 202 further includes epitaxial P-type silicon germanium regions 214, leaving remaining semiconductor regions 216 of the upper region 202A of the semiconductor fin 202. The semiconductor region 216 may be the second channel 106 of the stacked channel structure 100, and in embodiments in which the upper region 202A includes P-type regions 214 (providing the source/drain (S/D) regions of a P-type second transistor), the semiconductor region 216 may take the form of any of the compressed second channels 106 discussed herein.

Although not depicted in FIG. 2A, but shown in FIG. 2B, the lower region 202B of the semiconductor fin 202 is associated with a second plurality of gate structures 218, such as NMOS gate structures. Each of the second plurality of gate structures 218 can include a gate electrode 220, a gate dielectric layer 222, and associated dielectric spacers. It is to be appreciated that the second plurality of gate structures 218 wraps the lower region 202B of the semiconductor fin 202 at locations into and out of the page with respect to the perspective shown in FIG. 2A and, thus, can only be seen in the cross-sectional view of FIG. 2B, i.e., at regions 218A.

Referring again to FIG. 2A, in an embodiment, the lower region 202B of the semiconductor fin 202 may further include regrown source or drain regions. In the embodiment illustrated in FIG. 2A, the lower region 202B of the semiconductor fin 202 further includes epitaxial N-type silicon regions 226, leaving remaining semiconductor regions 228 of the lower region 202B of the semiconductor fin 202. The semiconductor region 228 may be the first channel 104 of the stacked channel structure 100, and embodiments in which the lower region 202B includes N-type regions 226 (providing the S/D regions of an N-type first transistor), the semiconductor region 228 may take the form of any of the tensile first channels 104 discussed herein (e.g., in combination with the compressed second channel 106, discussed above). A first insulator 108 of the stacked channel structure 100 may be disposed between the semiconductor region 228 and the semiconductor substrate 102, as shown, and may take the form of any of the embodiments disclosed herein (e.g., an oxide, nitride, or crystalline insulator).

In some embodiments, each of the first plurality of gate structures 206 is formed in a same trench as a corresponding one of the second plurality of gate structures 218, but vertically above the corresponding one of the second plurality of gate structures 218. In some such embodiments, each of the first plurality of gate structures 206 is isolated from the corresponding one of the second plurality of gate structures 218 by an insulating layer 224, as is depicted in FIG. 2B. However, in another embodiment, each of the first plurality of gate structures 206 forms a P-type gate and N-type gate junction with the corresponding one of the second plurality of gate structures 218 to effectively connect or short together certain of the gate pairings.

Referring again to FIGS. 2A and 2B, in an embodiment, wiring considerations such as backside wiring and wiring stacked between layers of semiconductor devices must be accounted for to bring the devices of the single fin together to form a circuit element. In some such embodiments, a first conductive contact 230 contacts a first P-type region 214 and a first N-type region 226 to form a Vout contact. A second conductive contact 232 contacts a second P-type region 214 to form a Vcc contact. Finally, a third conductive contact 234 contacts a second N-type region 226 to form a contact to ground (GND).

Referring again to FIGS. 2A and 2B, an entire inverter structure is fabricated on a single fin 202. That is, an entire circuit element is fabricated on a single semiconductor fin. As known in the art, such an inverter may be used to construct a static random access memory (SRAM) cell by coupling two such inverters with two pass gates. In some such embodiments, each such pass gate is also fabricated on a single fin.

Figure 3A:
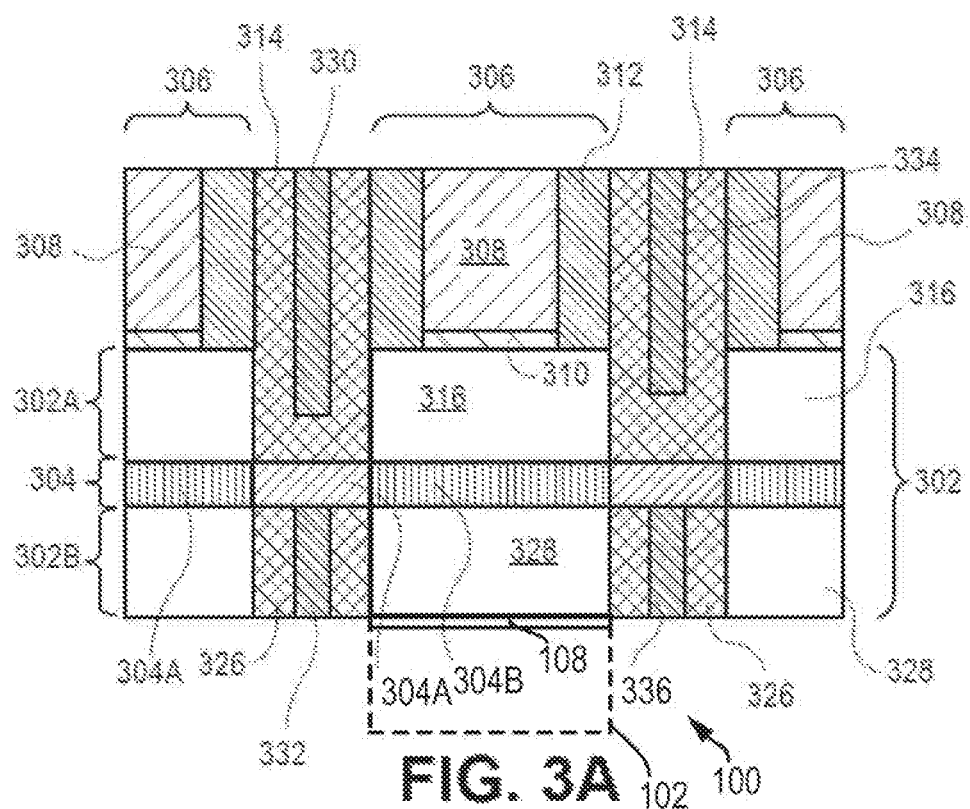
FIGS. 3A and 3B are cross-sectional views of a pass gate circuit element fabricated using a single semiconductor fin structure and including the stacked channel structure of FIG. 1, in accordance with various embodiments.
Figure 3B:
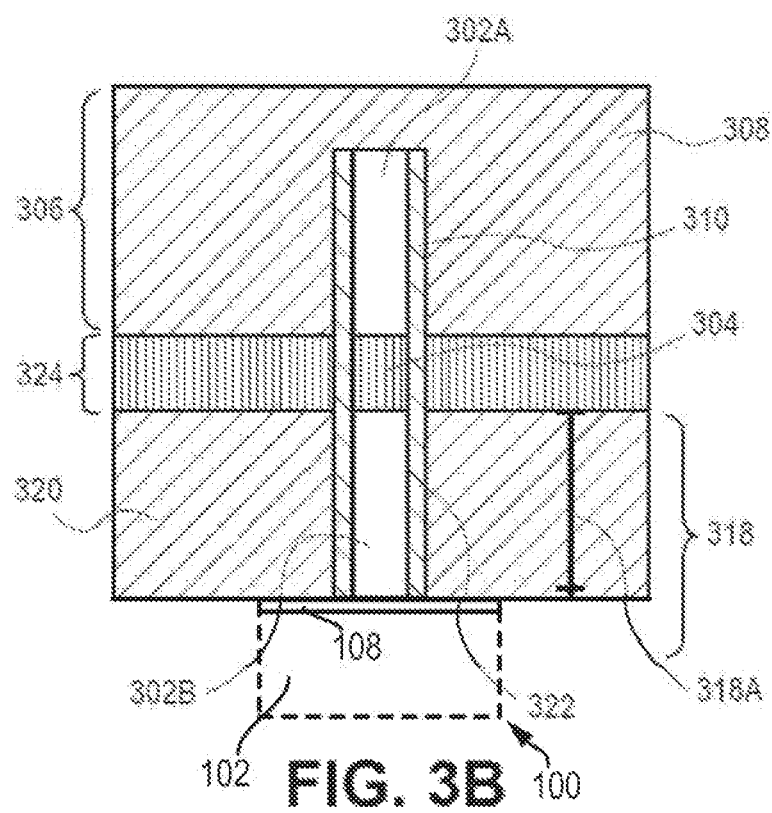

In a second example of a circuit element that may be fabricated using a single fin, FIGS. 3A and 3B are cross-sectional views of a pass gate circuit element fabricated using a single semiconductor fin structure and including the stacked channel structure 100, in accordance with various embodiments. FIG. 3A is a cross-sectional view taken through the gate structures and along the fin structure. FIG. 3B is a cross-sectional view taken through the fin structure and along the gate structures.

Referring to FIG. 3A, a semiconductor fin 302 (e.g., the fin 112 of the stacked channel structure 100) can be viewed as being separated vertically into an upper region 302A and a lower region 302B (e.g., the upper region 116 and the lower region 114, respectively, of the stacked channel structure 100). In one embodiment, the upper region 302A and the lower region 302B of the semiconductor fin 302 are separated by an insulating layer 304, such as a silicon oxide layer or other insulating oxide layer or a silicon nitride layer. The insulating layer 304 may include regions 304A and 304B of differing insulating material, depending on the integration scheme used to fabricate the structure, examples of which are described in greater detail below. For example, the region 304A may be the second insulator 110 of the stacked channel structure 100, and may be formed of an oxide, nitride, or crystalline insulator, as discussed above. The semiconductor fin 302 may extend away from the semiconductor substrate 102 of the stacked channel structure 100.

A first plurality of gate structures 306, such as NMOS gate structures, is included above the upper region 302A of the semiconductor fin 302. Each of the first plurality of gate structures 306 may include a gate electrode 308, a gate dielectric layer 310, and associated dielectric spacers 312. It is to be appreciated that the first plurality of gate structures 306 extends from the top of the upper region 302A of the semiconductor fin 302 (as shown) and further wraps the upper region 302A of the semiconductor fin 302 at locations into and out of the page with respect to the perspective shown in FIG. 3A. The upper region 302A of the semiconductor fin 302 may, in an embodiment, further include regrown source or drain regions. In the embodiment illustrated in FIG. 3A, the upper region 302A of the semiconductor fin 302 further includes first epitaxial N-type silicon regions 314, leaving remaining semiconductor regions 316 of the upper region 302A of the semiconductor fin 302. The semiconductor region 316 may be the second channel 106 of the stacked channel structure 100. In embodiments in which the upper region 302A includes N-type regions 314 (providing the S/D regions of an N-type second transistor), the semiconductor region 316 may take the form of any of the tensile second channels 106 discussed herein.

Although not depicted in FIG. 3A, but shown in FIG. 3B, the lower region 302B of the semiconductor fin 302 is associated with a second plurality of gate structures 318, such as a second plurality of NMOS gate structures. Each of the second plurality of gate structures 318 can include a gate electrode 320, a gate dielectric layer 322, and associated dielectric spacers. It is to be appreciated that the second plurality of gate structures 318 wraps the lower region 302B of the semiconductor fin 302 at locations into and out of the page with respect to the perspective shown in FIG. 3A and, thus, can only be seen in the cross-sectional view of FIG. 3B, i.e., at regions 318A.

Referring again to FIG. 3A, in an embodiment, the lower region 302B of the semiconductor fin 302 may further include regrown source or drain regions. In the embodiment illustrated in FIG. 3A, the lower region 302B of the semiconductor fin 302 further includes epitaxial N-type silicon regions 326, leaving remaining semiconductor regions 328 of the lower region 302B of the semiconductor fin 302. The semiconductor region 328 may be the first channel 104 of the stacked channel structure 100. In embodiments in which the lower region 302B includes N-type regions 326 (providing the S/D regions of an N-type first transistor), the semiconductor region 328 may take the form of any of the tensile first channels 104 discussed herein (e.g., in combination with a tensile second channel 106, discussed above). A first insulator 108 of the stacked channel structure 100 may be disposed between the semiconductor region 328 and the semiconductor substrate 102, as shown, and may take the form of any of the embodiments disclosed herein (e.g., an oxide, nitride, or crystalline insulator).

In some embodiments, each of the first plurality of gate structures 306 is formed in a same trench as a corresponding one of the second plurality of gate structures 318, but vertically above the corresponding one of the second plurality of gate structures 318. In some such embodiments, each of the first plurality of gate structures 306 has a same conductivity type (e.g., N-type) and is isolated from the corresponding one of the second plurality of gate structures 318 by an insulating layer 324, as is depicted in FIG. 3B.

Referring again to FIGS. 3A and 3B, in an embodiment, wiring considerations such as backside wiring and wiring stacked between layers of semiconductor devices must be accounted for to bring the devices of the single fin together to form a circuit element. In some such embodiments, a first conductive contact 330 contacts a first upper region 314 to form a connection to a first inverter element. A second conductive contact 332 contacts a first lower region 326 to form a connection to a second inverter element. A third conductive contact 334 contacts a second upper region 314 to form a first bitline contact. Finally, a fourth conductive contact 336 contacts a second lower region 326 to form a second bitline contact. Thus, an entire pass gate structure may be fabricated on a single fin 302.

It is to be appreciated that current solutions involve decreasing poly pitch and fin pitch, which puts tremendous constraint on process technology to etch/deposit/and perform lithography in ever smaller dimensions. By contrast, embodiments described herein may allow transistor density increase and improve performance without drawn pitch scaling. Embodiments may involve application of such an approach to AND gates (e.g., FIGS. 4A and 4B), OR gates (e.g., FIGS. 5A and 5B), NAND architectures (e.g., FIGS. 6A, 6B, 7A, and 7B), NOR architectures (e.g., FIGS. 8A-8D), inverters (e.g., FIGS. 2A and 2B), SRAM cells (e.g., FIGS. 2A, 2B, 3A, and 3B) and other random logic components.

Figure 4A:
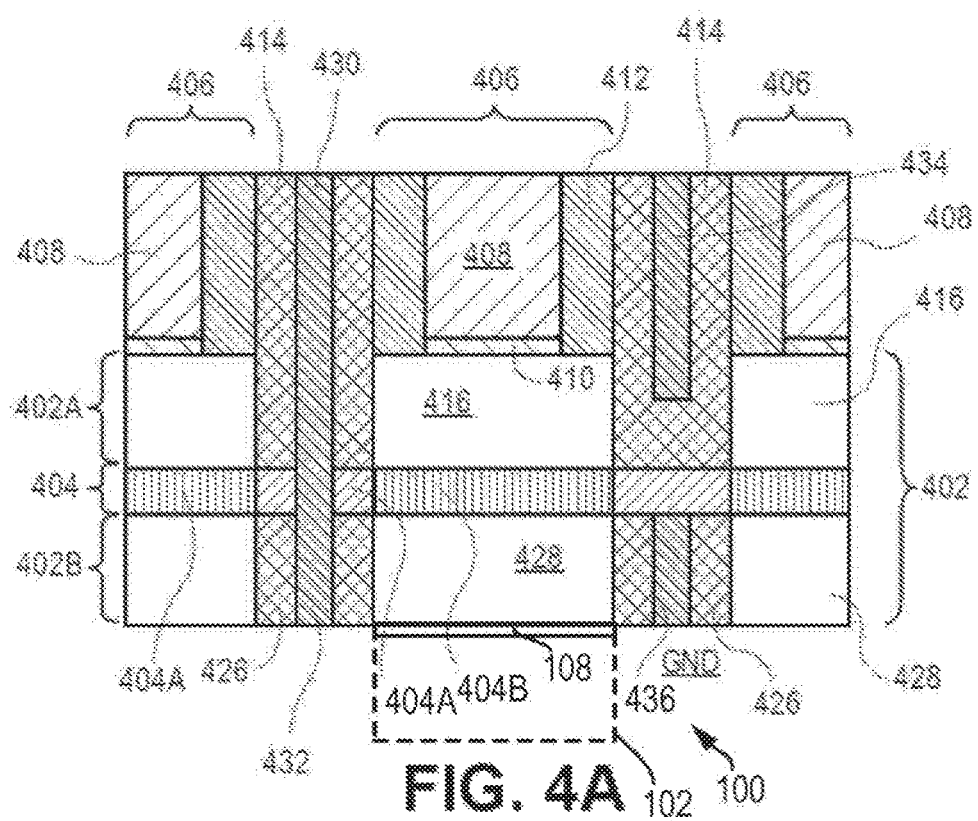
FIGS. 4A and 4B are cross-sectional views of an AND gate circuit element fabricated using a single semiconductor fin structure and including the stacked channel structure of FIG. 1, in accordance with various embodiments.
Figure 4B:
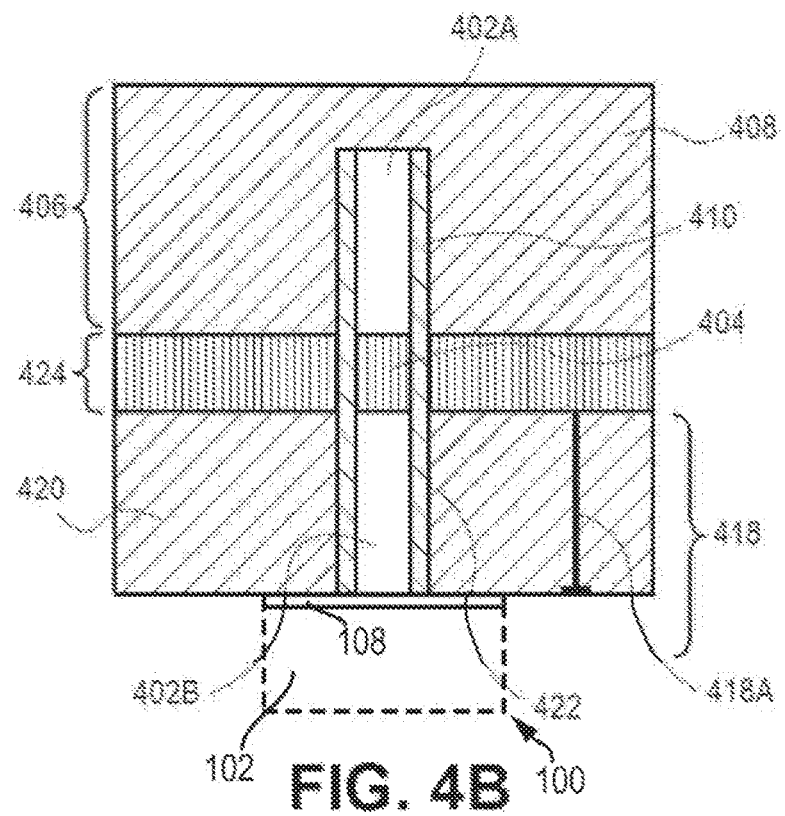

In a third example of a circuit element that may be fabricated using a single fin, FIGS. 4A and 4B are cross-sectional views of an AND gate circuit element fabricated using a single semiconductor fin structure and including the stacked channel structure 100, in accordance with various embodiments. FIG. 4A is a cross-sectional view taken through the gate structures and along the fin structure. FIG. 4B is a cross-sectional view taken through the fin structure and along the gate structures.

Referring to FIG. 4A, a semiconductor fin 402 (e.g., the fin 112 of the stacked channel structure 100) can be viewed as being separated vertically into an upper region 402A and a lower region 402B (e.g., the upper region 116 and the lower region 114, respectively, of the stacked channel structure 100). In one embodiment, the upper region 402A and the lower region 402B of the semiconductor fin 402 are separated by an insulating layer 404, such as a silicon oxide layer or other insulating oxide layer or a silicon nitride layer. The insulating layer 404 may include regions 404A and 404B of differing insulating material, depending on the integration scheme used to fabricate the structure, examples of which are described in greater detail below. For example, the region 404A may be the second insulator 110 of the stacked channel structure 100, and may be formed of an oxide, nitride, or crystalline insulator, as discussed above. The semiconductor fin 402 may extend away from the semiconductor substrate 102 of the stacked channel structure 100.

A first plurality of gate structures 406, such as NMOS gate structures, is included above the upper region 402A of the semiconductor fin 402. Each of the first plurality of gate structures 406 may include a gate electrode 408, a gate dielectric layer 410, and associated dielectric spacers 412. It is to be appreciated that the first plurality of gate structures 406 extends from the top of the upper region 402A of the semiconductor fin 402 (as shown) and further wraps the upper region 402A of the semiconductor fin 402 at locations into and out of the page with respect to the perspective shown in FIG. 4A. The upper region 402A of the semiconductor fin 402 may, in an embodiment, further include regrown source or drain regions. In the embodiment illustrated in FIG. 4A, the upper region 402A of the semiconductor fin 402 further includes first epitaxial N-type silicon regions 414, leaving remaining semiconductor regions 416 of the upper region 402A of the semiconductor fin 402. The semiconductor region 416 may be the second channel 106 of the stacked channel structure 100. In embodiments in which the upper region 402A includes N-type regions 414 (providing the S/D regions of an N-type second transistor), the semiconductor region 416 may take the form of any of the tensile second channels 106 discussed herein.

Although not depicted in FIG. 4A, but shown in FIG. 4B, the lower region 402B of the semiconductor fin 402 is associated with a second plurality of gate structures 418, such as a second plurality of NMOS gate structures. Each of the second plurality of gate structures 418 can include a gate electrode 420, a gate dielectric layer 422, and associated dielectric spacers. It is to be appreciated that the second plurality of gate structures 418 wraps the lower region 402B of the semiconductor fin 402 at locations into and out of the page with respect to the perspective shown in FIG. 4A and, thus, can only be seen in the cross-sectional view of FIG. 4B, i.e., at regions 418A.

Referring again to FIG. 4A, in an embodiment, the lower region 402B of the semiconductor fin 402 may further include regrown source or drain regions. In the embodiment illustrated in FIG. 4A, the lower region 402B of the semiconductor fin 402 further includes epitaxial N-type silicon regions 426, leaving remaining semiconductor regions 428 of the lower region 402B of the semiconductor fin 402. The semiconductor region 428 may be the first channel 104 of the stacked channel structure 100. In embodiments in which the lower region 402B includes N-type regions 426 (providing the S/D regions of an N-type first transistor), the semiconductor region 428 may take the form of any of the tensile first channels 104 discussed herein (e.g., in combination with the tensile second channel 106, discussed above). A first insulator 108 of the stacked channel structure 100 may be disposed between the semiconductor region 428 and the semiconductor substrate 102, as shown, and may take the form of any of the embodiments disclosed herein (e.g., an oxide, nitride, or crystalline insulator).

In some embodiments, each of the first plurality of gate structures 406 is formed in a same trench as a corresponding one of the second plurality of gate structures 418, but vertically above the corresponding one of the second plurality of gate structures 418. In some such embodiments, each of the first plurality of gate structures 406 has a same conductivity type (e.g., N-type) and is isolated from the corresponding one of the second plurality of gate structures 418 by an insulating layer 424, as is depicted in FIG. 4B.

Referring again to FIGS. 4A and 4B, in an embodiment, wiring considerations such as backside wiring and wiring stacked between layers of semiconductor devices must be accounted for to bring the devices of the single fin together to form a circuit element. In some such embodiments, a first conductive contact 430 contacts a first upper region 414 and a first lower region 426 to form a contact. A second conductive contact 432 contacts a second upper region 414 to form an OUT terminal. Finally, a third conductive contact 434 contacts a second lower region 426 to form a contact to ground (GND). Thus, an entire AND gate structure may be fabricated on a single fin 402.

Figure 5A:
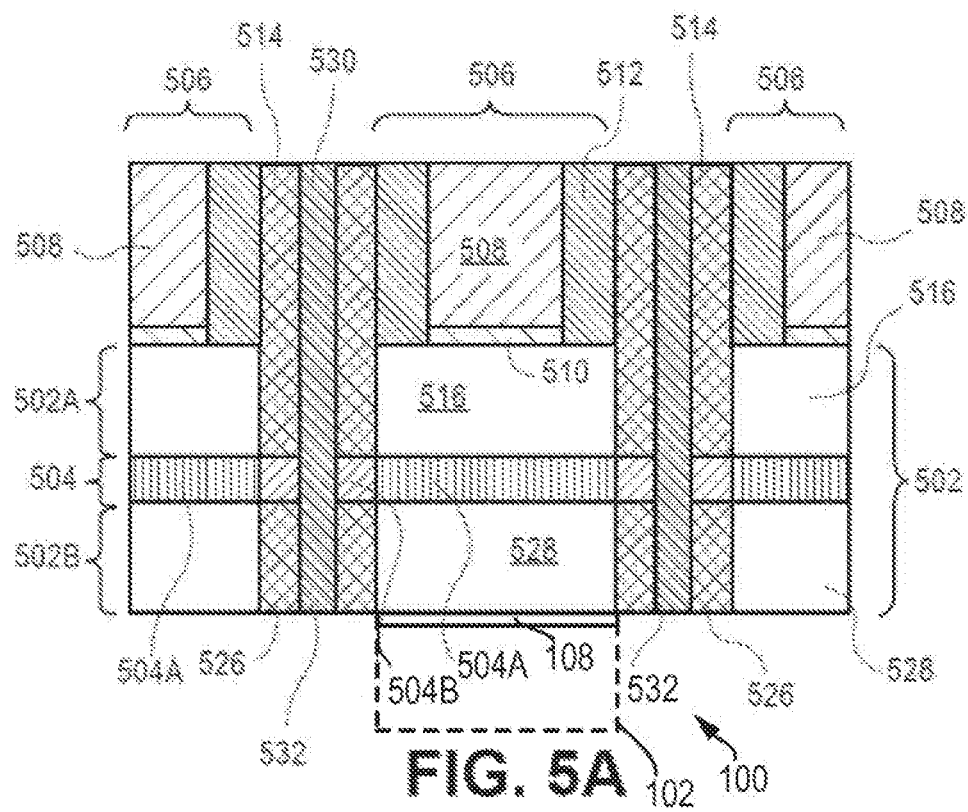
FIGS. 5A and 5B are cross-sectional views of an OR gate circuit element fabricated using a single semiconductor fin structure and including the stacked channel structure of FIG. 1, in accordance with various embodiments.
Figure 5B:
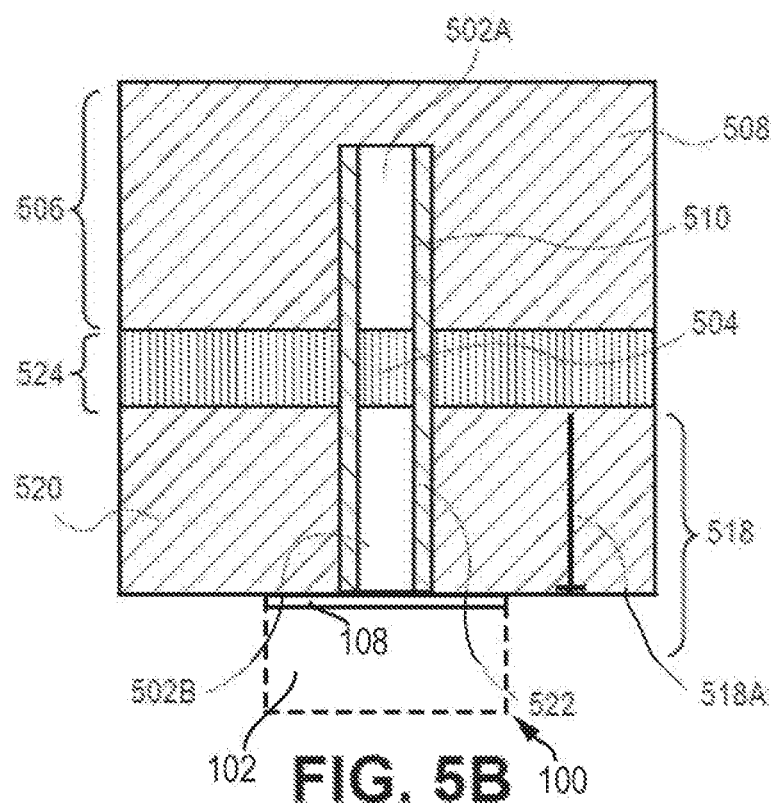

In a fourth example of a circuit element that may be fabricated using a single fin, FIGS. 5A and 5B are cross-sectional views of an OR gate circuit element fabricated using a single semiconductor fin structure and including the stacked channel structure 100, in accordance with various embodiments. FIG. 5A is a cross-sectional view taken through the gate structures and along the fin structure. FIG. 5B is a cross-sectional view taken through the fin structure and along the gate structures.

Referring to FIG. 5A, a semiconductor fin 502 (e.g., the fin 112 of the stacked channel structure 100) can be viewed as being separated vertically into an upper region 502A and a lower region 502B (e.g., the upper region 116 and the lower region 114, respectively, of the stacked channel structure 100). In one embodiment, the upper region 502A and the lower region 502B of the semiconductor fin 502 are separated by an insulating layer 504, such as a silicon oxide layer or other insulating oxide layer or a silicon nitride layer. The insulating layer 504 may include regions 504A and 504B of differing insulating material, depending on the integration scheme used to fabricate the structure, examples of which are described in greater detail below. For example, the region 504A may be the second insulator 110 of the stacked channel structure 100, and may be formed of an oxide, nitride, or crystalline insulator, as discussed above. The semiconductor fin 502 may extend away from the semiconductor substrate 102 of the stacked channel structure 100.

A first plurality of gate structures 506, such as NMOS gate structures, is included above the upper region 502A of the semiconductor fin 502. Each of the first plurality of gate structures 506 may include a gate electrode 508, a gate dielectric layer 510, and associated dielectric spacers 512. It is to be appreciated that the first plurality of gate structures 506 extends from the top of the upper region 502A of the semiconductor fin 502 (as shown) and further wraps the upper region 502A of the semiconductor fin 502 at locations into and out of the page with respect to the perspective shown in FIG. 5A. The upper region 502A of the semiconductor fin 502 may, in an embodiment, further include regrown source or drain regions. In the embodiment illustrated in FIG. 5A, the upper region 502A of the semiconductor fin 502 further includes first epitaxial N-type silicon regions 514, leaving remaining semiconductor regions 516 of the upper region 502A of the semiconductor fin 502. The semiconductor region 516 may be the second channel 106 of the stacked channel structure 100. In embodiments in which the upper region 502A includes N-type regions 514 (providing the S/D regions of an N-type second transistor), the semiconductor region 516 may take the form of any of the tensile second channels 106 discussed herein.

Although not depicted in FIG. 5A, but shown in FIG. 5B, the lower region 502B of the semiconductor fin 502 is associated with a second plurality of gate structures 518, such as a second plurality of NMOS gate structures. Each of the second plurality of gate structures 518 can include a gate electrode 520, a gate dielectric layer 522, and associated dielectric spacers. It is to be appreciated that the second plurality of gate structures 518 wraps the lower region 502B of the semiconductor fin 502 at locations into and out of the page with respect to the perspective shown in FIG. 5A and, thus, can only be seen in the cross-sectional view of FIG. 5B, i.e., at regions 518A.

Referring again to FIG. 5A, in an embodiment, the lower region 502B of the semiconductor fin 502 may further include regrown source or drain regions. In the embodiment illustrated in FIG. 5A, the lower region 502B of the semiconductor fin 502 further includes epitaxial N-type silicon regions 526, leaving remaining semiconductor regions (such as silicon regions) 528 of the lower region 502B of the semiconductor fin 502. The semiconductor region 528 may be the first channel 104 of the stacked channel structure 100. In embodiments in which the lower region 502B includes N-type regions 526 (providing the S/D regions of an N-type first transistor), the semiconductor region 528 may take the form of any of the tensile first channels 104 discussed herein (e.g., in combination with the tensile second channel 106, discussed above). A first insulator 108 of the stacked channel structure 100 may be disposed between the semiconductor region 528 and the semiconductor substrate 102, as shown, and may take the form of any of the embodiments disclosed herein (e.g., an oxide, nitride, or crystalline insulator).

In some embodiments, each of the first plurality of gate structures 506 is formed in a same trench as a corresponding one of the second plurality of gate structures 518, but vertically above the corresponding one of the second plurality of gate structures 518. In some such embodiments, each of the first plurality of gate structures 506 has a same conductivity type (e.g., N-type) and is isolated from the corresponding one of the second plurality of gate structures 518 by an insulating layer 524, as is depicted in FIG. 5B.

Referring again to FIGS. 5A and 5B, in an embodiment, wiring considerations such as backside wiring and wiring stacked between layers of semiconductor devices must be accounted for to bring the devices of the single fin together to form a circuit element. In some such embodiments, a first conductive contact 530 contacts a first upper region 514 and a first lower region 526. A second conductive contact 532 contacts a second upper region 514 and a second lower region 526. Thus, an entire OR gate structure may be fabricated on a single fin 502.

NAND gate architectures can be divided into two parallel PMOS (e.g., FIGS. 6A and 6B) with output nodes connected to two serial NMOS (e.g., FIGS. 7A and 7B), as described below.

Figure 6A:
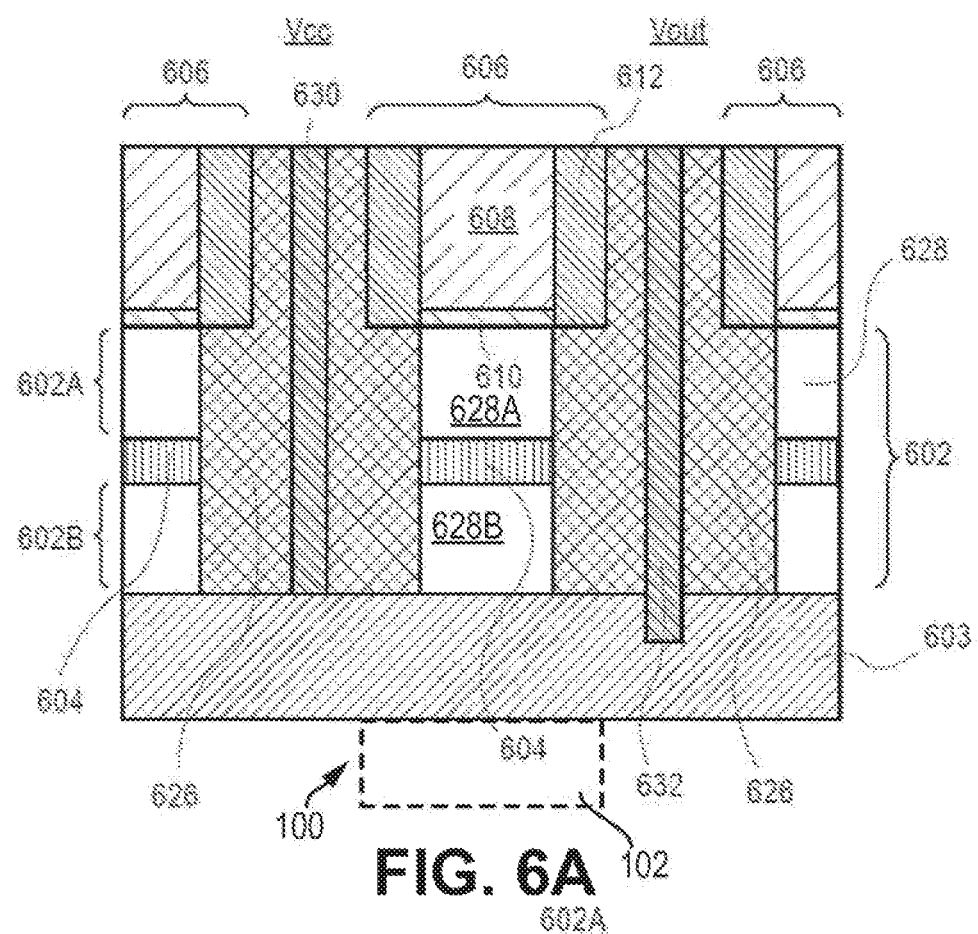
FIGS. 6A and 6B are cross-sectional views of a circuit element based on two parallel p-type metal oxide semiconductor (PMOS) devices fabricated using a single semiconductor fin structure, and including the stacked channel structure of FIG. 1, as a component of a NAND gate circuit element, in accordance with various embodiments.
Figure 6B:
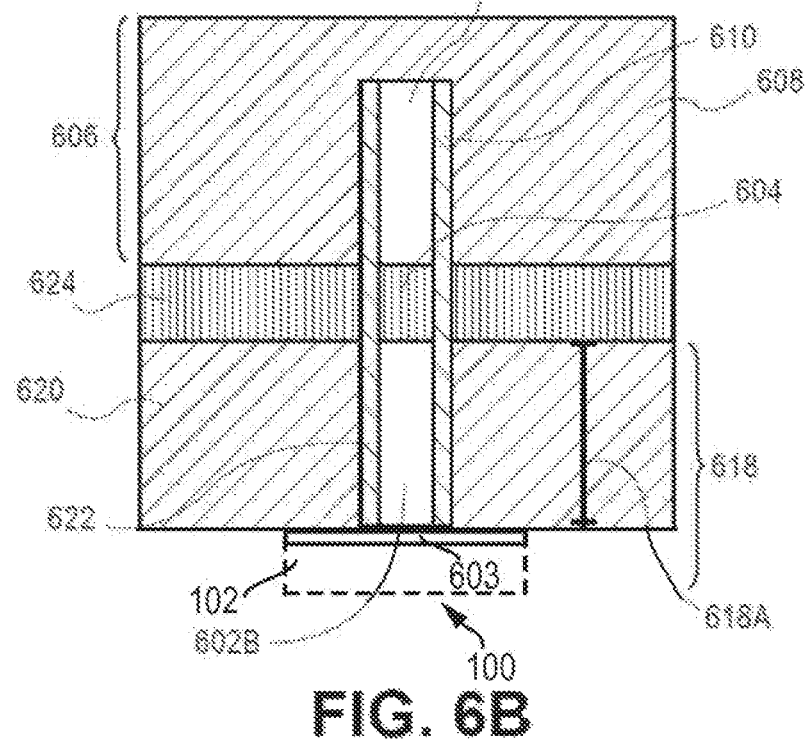

In a fifth example of a circuit element that may be fabricated using a single fin, FIGS. 6A and 6B are cross-sectional views of a circuit element based on two parallel PMOS devices fabricated using a single semiconductor fin structure, and including the stacked channel structure 100, as a component of a NAND gate circuit element, in accordance with various embodiments. FIG. 6A is a cross-sectional view taken through the gate structures and along the fin structure. FIG. 6B is a cross-sectional view taken through the fin structure and along the gate structures.

Referring to FIG. 6A, a semiconductor fin 602 (e.g., the fin 112 of the stacked channel structure 100) can be viewed as being separated vertically into an upper region 602A and a lower region 602B (e.g., the upper region 116 and the lower region 114, respectively, of the stacked channel structure 100). In one embodiment, the upper region 602A and the lower region 602B of the semiconductor fin 602 are separated by an insulating layer 604, such as a silicon oxide layer or other insulating oxide layer or a silicon nitride layer. For example, the insulating layer 604 may be the second insulator 110 of the stacked channel structure 100, and may be formed of an oxide or nitride, as indicated above, or a crystalline insulator, as discussed above. The semiconductor fin 602 may be further disposed on an insulating layer 603 (e.g., the first insulator 108 of the stacked channel structure 100), as is depicted in FIG. 6A, which may in turn be disposed on the semiconductor substrate 102 of the stacked channel structure 100. The semiconductor fin 602 may extend away from the semiconductor substrate 102.

A first plurality of PMOS gate structures 606 is included above the upper region 602A of the semiconductor fin 602. Each of the first plurality of PMOS gate structures 606 can include a gate electrode 608, a gate dielectric layer 610, and associated dielectric spacers 612. It is to be appreciated that the first plurality of PMOS gate structures 606 extends from the top of the upper region 602A of the semiconductor fin 602 (as shown) and further wraps the upper region 602A of the semiconductor fin 602 at locations into and out of the page with respect to the perspective shown in FIG. 6A.

Although not depicted in FIG. 6A, but shown in FIG. 6B, the lower region 602B of the semiconductor fin 602 is associated with a second plurality of PMOS gate structures 618. Each of the second plurality of PMOS gate structures 618 can include a gate electrode 620, a gate dielectric layer 622, and associated dielectric spacers. It is to be appreciated that the second plurality of PMOS gate structures 618 wraps the lower region 602B of the semiconductor fin 602 at locations into and out of the page with respect to the perspective shown in FIG. 6A and, thus, can only be seen in the cross-sectional view of FIG. 6B, i.e., at regions 618A.

Referring again to FIG. 6A, in an embodiment, both the upper region 602A and the lower region 602B of the semiconductor fin 602 may further include regrown source or drain regions. In the embodiment illustrated in FIG. 6A, both the upper region 602A and the lower region 602B of the semiconductor fin 602 further include epitaxial P-type silicon germanium regions 626, leaving remaining semiconductor regions 628A and B of the semiconductor fin 602. In particular, the region 628A may be the second channel 106 of the stacked channel structure 100, and the region 628B may be the first channel 104 of the stacked channel structure 100. The P-type regions 626 may provide the S/D regions of P-type first and second transistors associated with the first channel 104 and the second channel 106, respectively. The regions 628A and 628B may take the form of any of the compressed second channels 106 and first channels 104, respectively, discussed herein.

In an embodiment, each of the first plurality of PMOS gate structures 606 is formed in a same trench as a corresponding one of the second plurality of PMOS gate structures 618, but vertically above the corresponding one of the second plurality of PMOS gate structures 618. In one such embodiment, each of the first plurality of PMOS gate structures 606 is isolated from the corresponding one of the second plurality of PMOS gate structures 618 by an insulating layer 624, as is depicted in FIG. 6B.

Referring again to FIGS. 6A and 6B, in some embodiments, wiring considerations such as backside wiring and wiring stacked between layers of semiconductor devices must be accounted for to bring the devices of the single fin together to form a circuit element. In one such embodiment, a first conductive contact 630 contacts a first epitaxial P-type silicon germanium region 626 to form a Vcc contact. A second conductive contact 632 contacts a second epitaxial P-type silicon germanium region 626 to form a Vout contact.

Figure 7A:
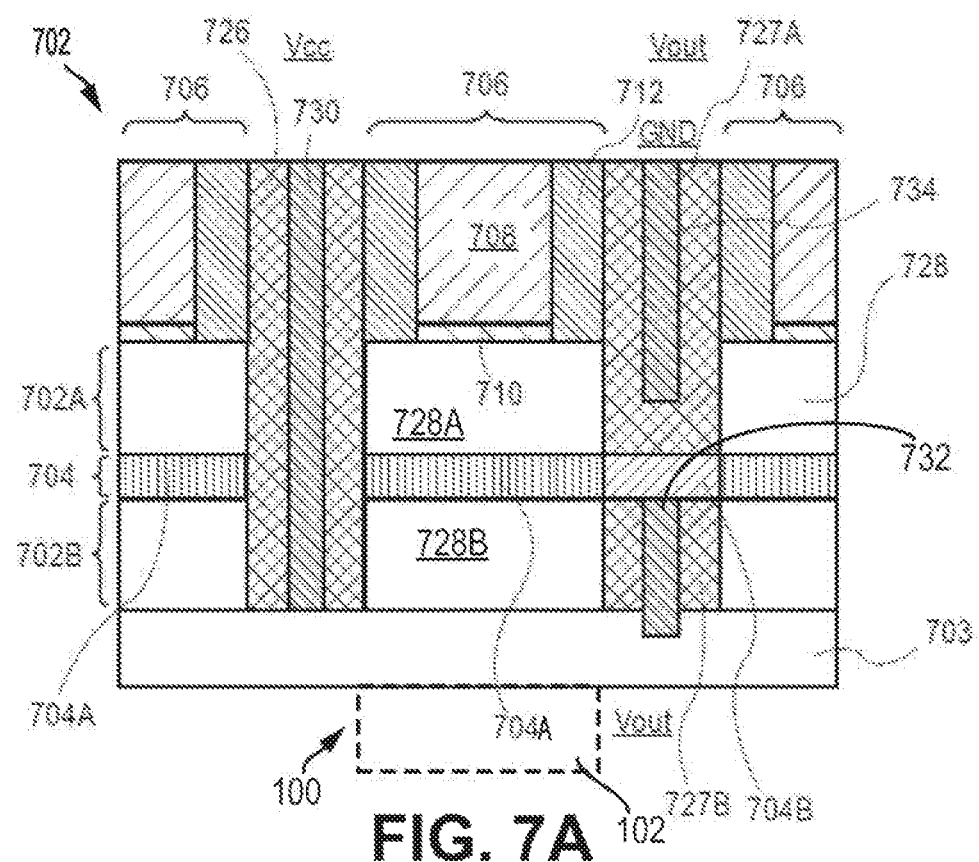
FIGS. 7A and 7B illustrate cross-sectional views of a circuit element based on two serial n-type metal oxide semiconductor (NMOS) devices fabricated using a single semiconductor fin structure, and including the stacked channel structure of FIG. 1, as a component of a NAND gate circuit element for coupling with the two parallel PMOS devices of FIGS. 6A and 6B, in accordance with various embodiments.
Figure 7B:
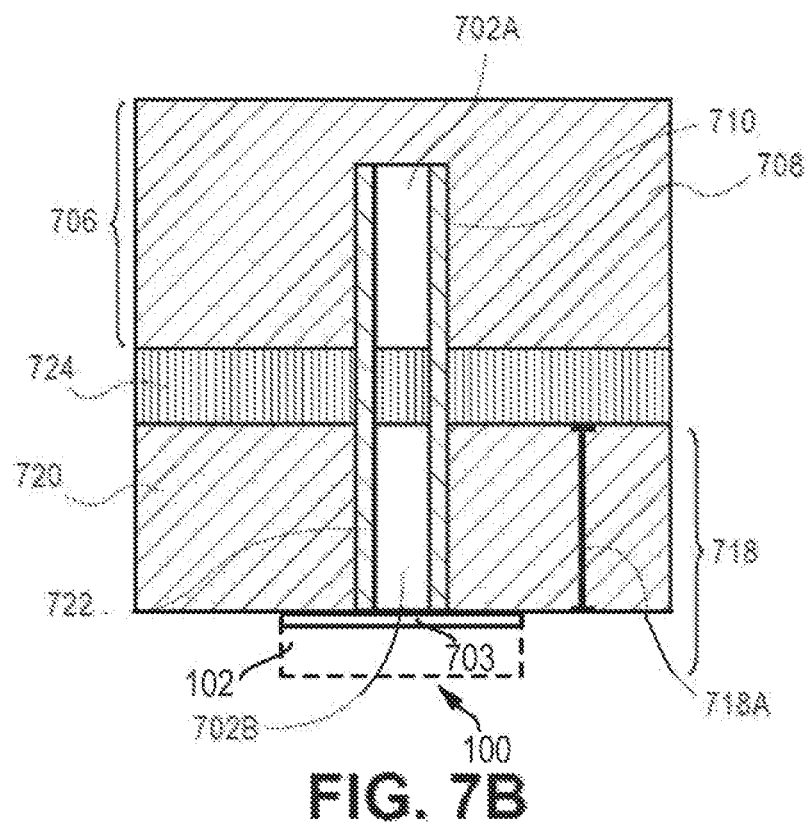

In a sixth example of a circuit element that may be fabricated using a single fin, FIGS. 7A and 7B are cross-sectional views of a circuit element based on two serial NMOS devices fabricated using a single semiconductor fin structure, and including the stacked channel structure 100, as a component of a NAND gate circuit element for coupling with the two parallel PMOS devices of FIGS. 6A and 6B, in accordance with various embodiments. FIG. 7A is a cross-sectional view taken through the gate structures and along the fin structure. FIG. 7B is a cross-sectional view taken through the fin structure and along the gate structures.

Referring to FIG. 7A, a semiconductor fin 702 (e.g., the fin 112 of the stacked channel structure 100) can be viewed as being separated vertically into an upper region 702A and a lower region 702B (e.g., the upper region 116 and the lower region 114, respectively, of the stacked channel structure 100). In one embodiment, a portion of the upper region 702A and the lower region 702B of the semiconductor fin 702 are separated by an insulating layer 704A, such as a silicon oxide layer or other insulating oxide layer or a silicon nitride layer. For example, the insulating layer 704A may be the second insulator 110 of the stacked channel structure 100, and may be formed of an oxide or nitride, as indicated above, or a crystalline insulator, as discussed above. The semiconductor fin 702 may be further disposed on an insulating layer 703, (e.g., the first insulator 108 of the stacked channel structure 100), as is depicted in FIG. 7A, which may in turn be disposed on the semiconductor substrate 102 of the stacked channel structure 100. The semiconductor fin 702 may extend away from the semiconductor substrate 102.

A first plurality of NMOS gate structures 706 is included above the upper region 702A of the semiconductor fin 702. Each of the first plurality of NMOS gate structures 706 can include a gate electrode 708, a gate dielectric layer 710, and associated dielectric spacers 712. It is to be appreciated that the first plurality of NMOS gate structures 706 extends from the top of the upper region 702A of the semiconductor fin 702 (as shown) and further wraps the upper region 702A of the semiconductor fin 702 at locations into and out of the page with respect to the perspective shown in FIG. 7A.

Although not depicted in FIG. 7A, but shown in FIG. 7B, the lower region 702B of the semiconductor fin 702 is associated with a second plurality of NMOS gate structures 718. Each of the second plurality of NMOS gate structures 718 can include a gate electrode 720, a gate dielectric layer 722, and associated dielectric spacers. It is to be appreciated that the second plurality of NMOS gate structures 718 wraps the lower region 702B of the semiconductor fin 702 at locations into and out of the page with respect to the perspective shown in FIG. 7A and, thus, can only be seen in the cross-sectional view of FIG. 7B, i.e., at regions 718A.

Referring again to FIG. 7A, in an embodiment, both the upper region 702A and the lower region 702B of the semiconductor fin 702 may further include regrown source or drain regions. In the embodiment illustrated in FIG. 7A, both the upper region 702A and the lower region 702B of the semiconductor fin 702 further include an epitaxial N-type silicon region 726, leaving remaining semiconductor regions 728A and B of the semiconductor fin 702. In particular, the region 728A may be the second channel 106 of the stacked channel structure 100, and the region 728B may be the first channel 104 of the stacked channel structure 100. The N-type regions 726 may provide one set of S/D regions of N-type first and second transistors associated with the first channel 104 and the second channel 106, respectively. The regions 728A and 728B may take the form of any of the tensile second channels 106 and first channels 104, respectively, discussed herein. Also, an upper epitaxial N-type silicon region 727A is formed in only the upper region 702A of the semiconductor fin 702, while a lower epitaxial N-type silicon region 727B is formed in only the lower region 702B of the semiconductor fin 702. The N-type regions 727A and 727B may provide another set of S/D regions of N-type first and second transistors associated with the first channel 104 and the second channel 106, respectively, as discussed above with reference to the N-type region 726. The insulating layer portion 704B separates the upper epitaxial N-type silicon region 727A from the lower epitaxial N-type silicon region 727B (and may include, e.g., an oxide or nitride).

In an embodiment, each of the first plurality of NMOS gate structures 706 is formed in a same trench as a corresponding one of the second plurality of NMOS gate structures 718, but vertically above the corresponding one of the second plurality of NMOS gate structures 718. In one such embodiment, each of the first plurality of NMOS gate structures 706 is isolated from the corresponding one of the second plurality of NMOS gate structures 718 by an insulating layer 724, as is depicted in FIG. 7B.

Referring again to FIGS. 7A and 7B, in an embodiment, wiring considerations such as backside wiring and wiring stacked between layers of semiconductor devices must be accounted for to bring the devices of the single fin together to form a circuit element. In one such embodiment, a first conductive contact 730 contacts the epitaxial N-type silicon region 726. A second conductive contact 732 contacts the lower epitaxial N-type silicon region 727B to form a Vout contact. A third conductive contact 734 contacts the upper epitaxial N-type silicon region 727A to form a contact to ground (GND).

In a manner similar to the NAND architecture, NOR gate architecture can be divided into two parallel NMOS (e.g., FIGS. 8A and 8B), the output of which is connected to output of two serial PMOS (e.g., FIGS. 8C and 8D), as is described below.

Figure 8A:
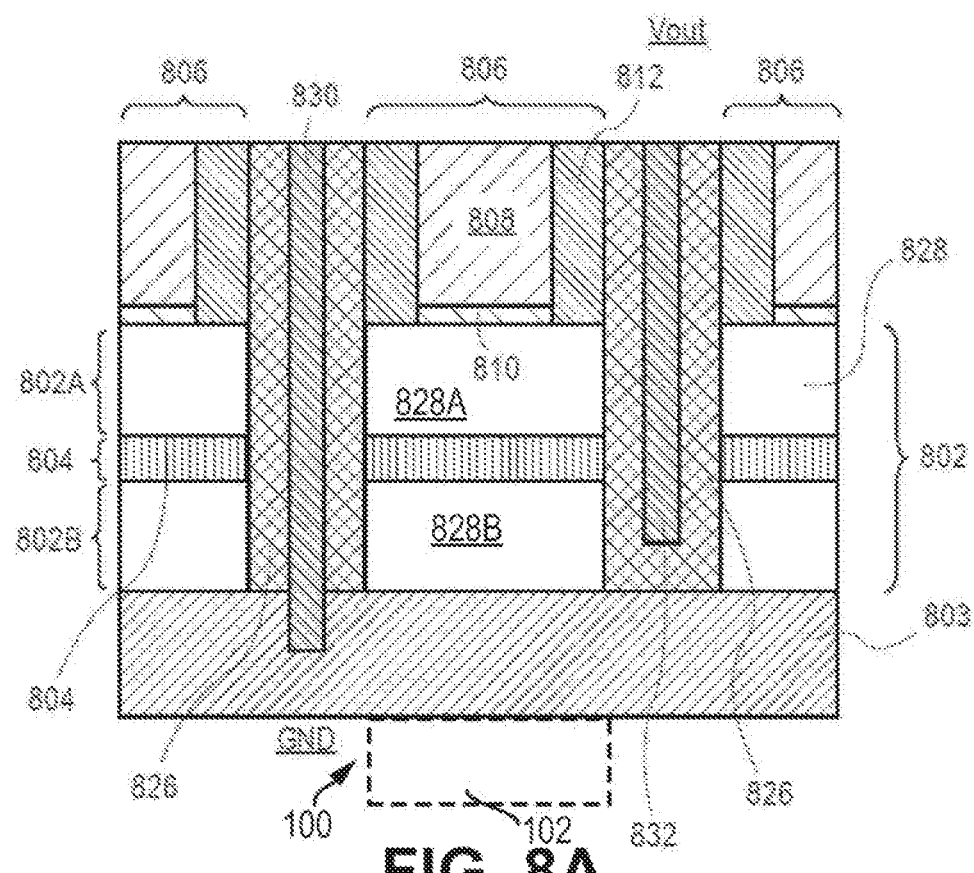
FIGS. 8A and 8B are cross-sectional views of a circuit element based on two parallel NMOS devices fabricated using a single semiconductor fin structure, and including the stacked channel structure of FIG. 1, as a component of a NOR gate circuit element, in accordance with various embodiments.
Figure 8B:
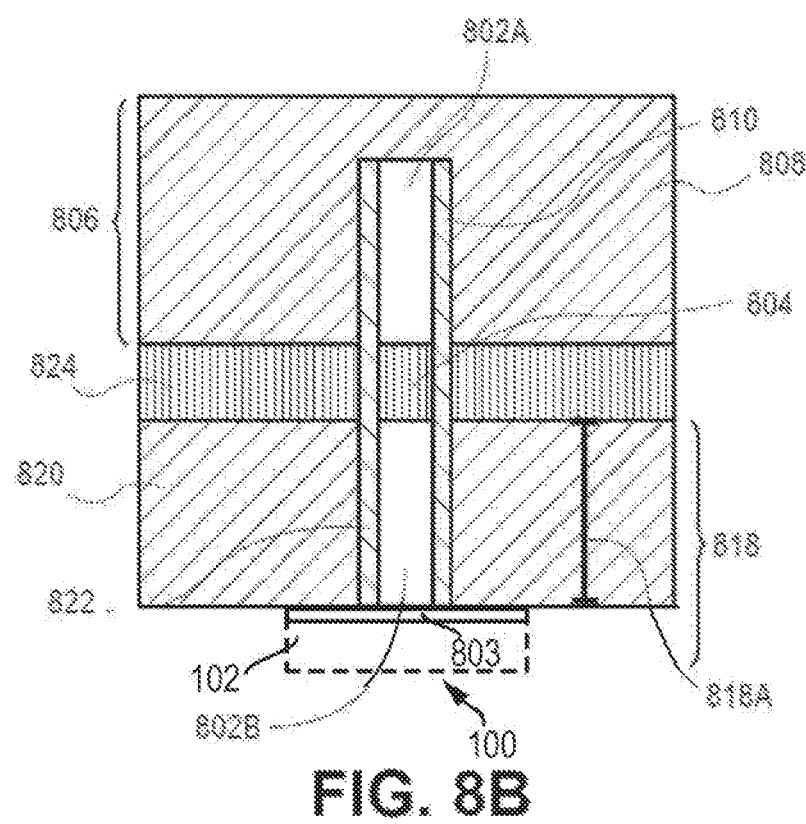

In a seventh example of a circuit element that may be fabricated using a single fin, FIGS. 8A and 8B are cross-sectional views of a circuit element based on two parallel NMOS devices fabricated using a single semiconductor fin structure, and including the stacked channel structure 100, as a component of a NOR gate circuit element, in accordance with various embodiments. FIG. 8A is a cross-sectional view taken through the gate structures and along the fin structure. FIG. 8B is a cross-sectional view taken through the fin structure and along the gate structures.

Referring to FIG. 8A, a semiconductor fin 802 (e.g., the fin 112 of the stacked channel structure 100) can be viewed as being separated vertically into an upper region 802A and a lower region 802B (e.g., the upper region 116 and the lower region 114, respectively, of the stacked channel structure 100). In one embodiment, the upper region 802A and the lower region 802B of the semiconductor fin 802 are separated by an insulating layer 804, such as a silicon oxide layer or other insulating oxide layer or a silicon nitride layer. For example, the insulating layer 804 may be the second insulator 110 of the stacked channel structure 100, and may be formed with an oxide or nitride, as indicated above, or a crystalline insulator, as discussed above. The semiconductor fin 802 may be further disposed on an insulating layer 803 (e.g., the first insulator 108 of the stacked channel structure 100), as is depicted in FIG. 8A, which may in turn be disposed on the semiconductor substrate 102 of the stacked channel structure 100. The semiconductor fin 802 may extend away from the semiconductor substrate 102.

A first plurality of NMOS gate structures 806 is included above the upper region 802A of the semiconductor fin 802. Each of the first plurality of NMOS gate structures 806 can include a gate electrode 808, a gate dielectric layer 810, and associated dielectric spacers 812. It is to be appreciated that the first plurality of NMOS gate structures 806 extends from the top of the upper region 802A of the semiconductor fin 802 (as shown) and further wraps the upper region 802A of the semiconductor fin 802 at locations into and out of the page with respect to the perspective shown in FIG. 8A.

Although not depicted in FIG. 8A, but shown in FIG. 8B, the lower region 802B of the semiconductor fin 802 is associated with a second plurality of NMOS gate structures 818. Each of the second plurality of NMOS gate structures 818 can include a gate electrode 820, a gate dielectric layer 822, and associated dielectric spacers. It is to be appreciated that the second plurality of NMOS gate structures 818 wraps the lower region 802B of the semiconductor fin 802 at locations into and out of the page with respect to the perspective shown in FIG. 8A and, thus, can only be seen in the cross-sectional view of FIG. 8B, i.e., at regions 818A.

Referring again to FIG. 8A, in an embodiment, both the upper region 802A and the lower region 802B of the semiconductor fin 802 may further include regrown source or drain regions. In the embodiment illustrated in FIG. 8A, both the upper region 802A and the lower region 802B of the semiconductor fin 802 further include epitaxial N-type silicon regions 826, leaving remaining semiconductor regions 828A and B of the semiconductor fin 802. In particular, the region 828A may be the second channel 106 of the stacked channel structure 100, and the region 828B may be the first channel 104 of the stacked channel structure 100. The N-type regions 826 may provide the S/D regions of N-type first and second transistors associated with the first channel 104 and the second channel 106, respectively. The regions 828A and 828B may take the form of any of the tensile second channels 106 and first channels 104, respectively, discussed herein.

In an embodiment, each of the first plurality of NMOS gate structures 806 is formed in a same trench as a corresponding one of the second plurality of NMOS gate structures 818, but vertically above the corresponding one of the second plurality of NMOS gate structures 818. In one such embodiment, each of the first plurality of NMOS gate structures 806 is isolated from the corresponding one of the second plurality of NMOS gate structures 818 by an insulating layer 824, as is depicted in FIG. 8B.

Referring again to FIGS. 8A and 8B, in an embodiment, wiring considerations such as backside wiring and wiring stacked between layers of semiconductor devices must be accounted for to bring the devices of the single fin together to form a circuit element. In one such embodiment, a first conductive contact 830 contacts a first epitaxial N-type silicon region 826 to form a ground (GND) contact. A second conductive contact 832 contacts a second epitaxial N-type silicon region 826 to form a Vout contact. It is to be appreciated that the contacts can be made either from the top or from the bottom of the devices, depending on how it is determined to deliver power.

Figure 8C:
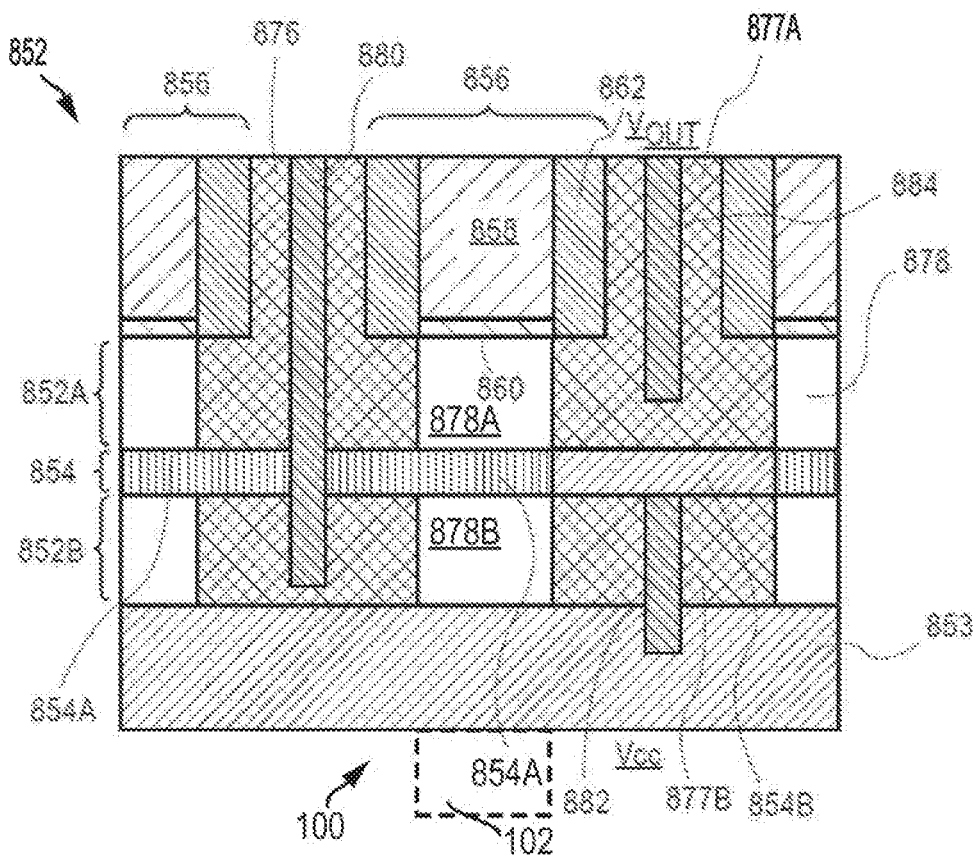
FIGS. 8C and 8D are cross-sectional views of a circuit element based on two serial PMOS devices fabricated using a single semiconductor fin structure, and including the stacked channel structure of FIG. 1, as a component of a NOR gate circuit element for coupling with the two parallel NMOS devices of FIGS. 8A and 8B, in accordance with various embodiments.
Figure 8D:
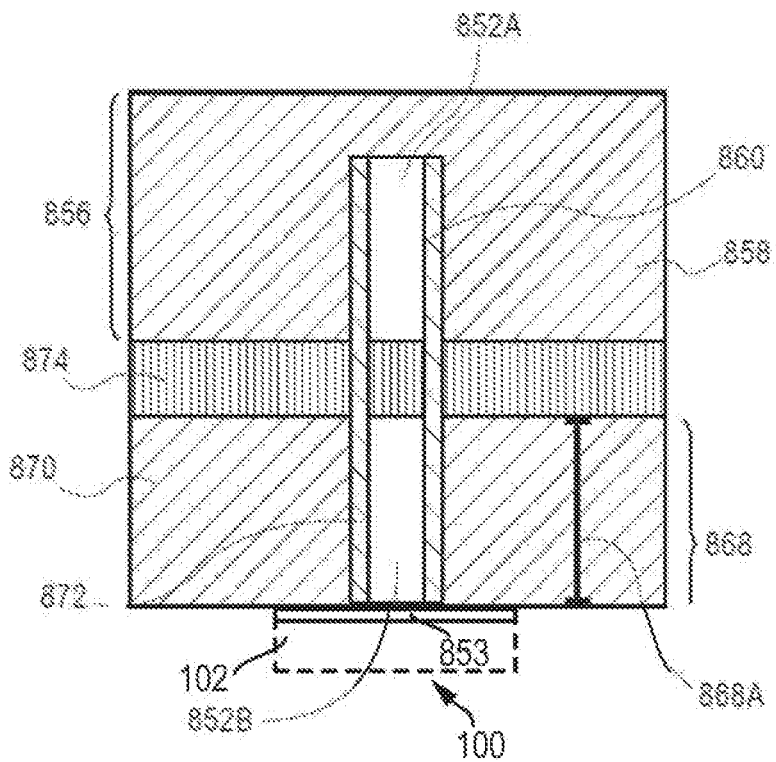

In an eighth example of a circuit element that may be fabricated using a single fin, FIGS. 8C and 8D illustrate cross-sectional views of a circuit element based on two serial PMOS devices fabricated using a single semiconductor fin structure, and including the stacked channel structure 100, as a component of a NOR gate circuit element for coupling with the two parallel NMOS devices of FIGS. 8A and 8B, in accordance with various embodiments. FIG. 8C is a cross-sectional view taken through the gate structures and along the fin structure. FIG. 8D is a cross-sectional view taken through the fin structure and along the gate structures.

Referring to FIG. 8C, a semiconductor fin 852 (e.g., the fin 112 of the stacked channel structure 100) can be viewed as being separated vertically into an upper region 852A and a lower region 852B (e.g., the upper region 116 and the lower region 114, respectively, of the stacked channel structure 100). In one embodiment, the upper region 852A and the lower region 852B of the semiconductor fin 852 are separated by an insulating layer 854A, such as a silicon oxide layer or other insulating oxide layer or a silicon nitride layer. For example, the insulating layer 854A may be the second insulator 110 of the stacked channel structure 100, and may be formed of an oxide or nitride, as indicated above, or a crystalline insulator, as discussed above. The semiconductor fin 852 may be further disposed on an insulating layer 853 (e.g., the first insulator 108 of the stacked channel structure 100), as is depicted in FIG. 8C, which may in turn be disposed on the semiconductor substrate 102 of the stacked channel structure 100. The semiconductor fin 852 may extend away from the semiconductor substrate 102.

A first plurality of PMOS gate structures 856 is included above the upper region 852A of the semiconductor fin 852. Each of the first plurality of PMOS gate structures 856 can include a gate electrode 858, a gate dielectric layer 860, and associated dielectric spacers 862. It is to be appreciated that the first plurality of PMOS gate structures 856 extends from the top of the upper region 852A of the semiconductor fin 852 (as shown) and further wraps the upper region 852A of the semiconductor fin 852 at locations into and out of the page with respect to the perspective shown in FIG. 8C.

Although not depicted in FIG. 8C, but shown in FIG. 8D, the lower region 852B of the semiconductor fin 852 is associated with a second plurality of PMOS gate structures 868. Each of the second plurality of PMOS gate structures 868 can include a gate electrode 870, a gate dielectric layer 872, and associated dielectric spacers. It is to be appreciated that the second plurality of PMOS gate structures 868 wraps the lower region 852B of the semiconductor fin 852 at locations into and out of the page with respect to the perspective shown in FIG. 8C and, thus, can only be seen in the cross-sectional view of FIG. 8D, i.e., at regions 868A.

Referring again to FIG. 8C, in an embodiment, both the upper region 852A and the lower region 852B of the semiconductor fin 852 may further include regrown source or drain regions. In the embodiment illustrated in FIG. 8A, both the upper region 852A and the lower region 852B of the semiconductor fin 852 further include an epitaxial P-type silicon germanium region 876, leaving remaining semiconductor regions 878A and B of the semiconductor fin 852. In particular, the region 878A may be the second channel 106 of the stacked channel structure 100, and the region 878B may be the first channel 104 of the stacked channel structure 100. The P-type regions 876 may provide one set of S/D regions of P-type first and second transistors associated with the first channel 104 and the second channel 106, respectively. The regions 878A and 878B may take the form of any of the compressed second channels 106 and first channel 104, respectively, discussed herein. Also, an upper epitaxial P-type silicon germanium region 877A is formed in only the upper region 852A of the semiconductor fin 852, while a lower epitaxial P-type silicon germanium region 877B is formed in only the lower region 852B of the semiconductor fin 852. The P-type regions 877A and 877B may provide another set of S/D regions of N-type first and second transistors associated with the first channel 104 and the second channel 106, respectively, as discussed above with reference to the P-type region 876. The insulating layer portion 854B separates the upper epitaxial P-type silicon germanium region 877A from the lower epitaxial P-type silicon germanium region 877B (may include, e.g., an oxide or nitride).

In an embodiment, each of the first plurality of PMOS gate structures 856 is formed in a same trench as a corresponding one of the second plurality of PMOS gate structures 868, but vertically above the corresponding one of the second plurality of PMOS gate structures 868. In one such embodiment, each of the first plurality of PMOS gate structures 856 is isolated from the corresponding one of the second plurality of PMOS gate structures 868 by an insulating layer 874, as is depicted in FIG. 8D.

Referring again to FIGS. 8C and 8D, in an embodiment, wiring considerations such as backside wiring and wiring stacked between layers of semiconductor devices must be accounted for to bring the devices of the single fin together to form a circuit element. In one such embodiment, a first conductive contact 880 contacts the epitaxial P-type silicon germanium region 876. A second conductive contact 882 contacts the lower epitaxial P-type silicon germanium region 877B to form a Vcc contact. A third conductive contact 884 contacts the upper epitaxial P-type silicon germanium region 877A to form a Vout contact. It is to be appreciated that the contacts can be made either from the top or from the bottom on the devices, depending on how it is determined to deliver power.

Any suitable manufacturing techniques may be used to form the circuit elements (including the stacked channel structures 100) disclosed herein. FIGS. 9-20 illustrate cross-sectional views of various operations for manufacturing an inverter structure (left hand side of each of FIGS. 9-20) and a pass gate structure (right hand side of each of FIGS. 9-20), each including a stacked channel structure 100, in accordance with various embodiments.

Figure 9:
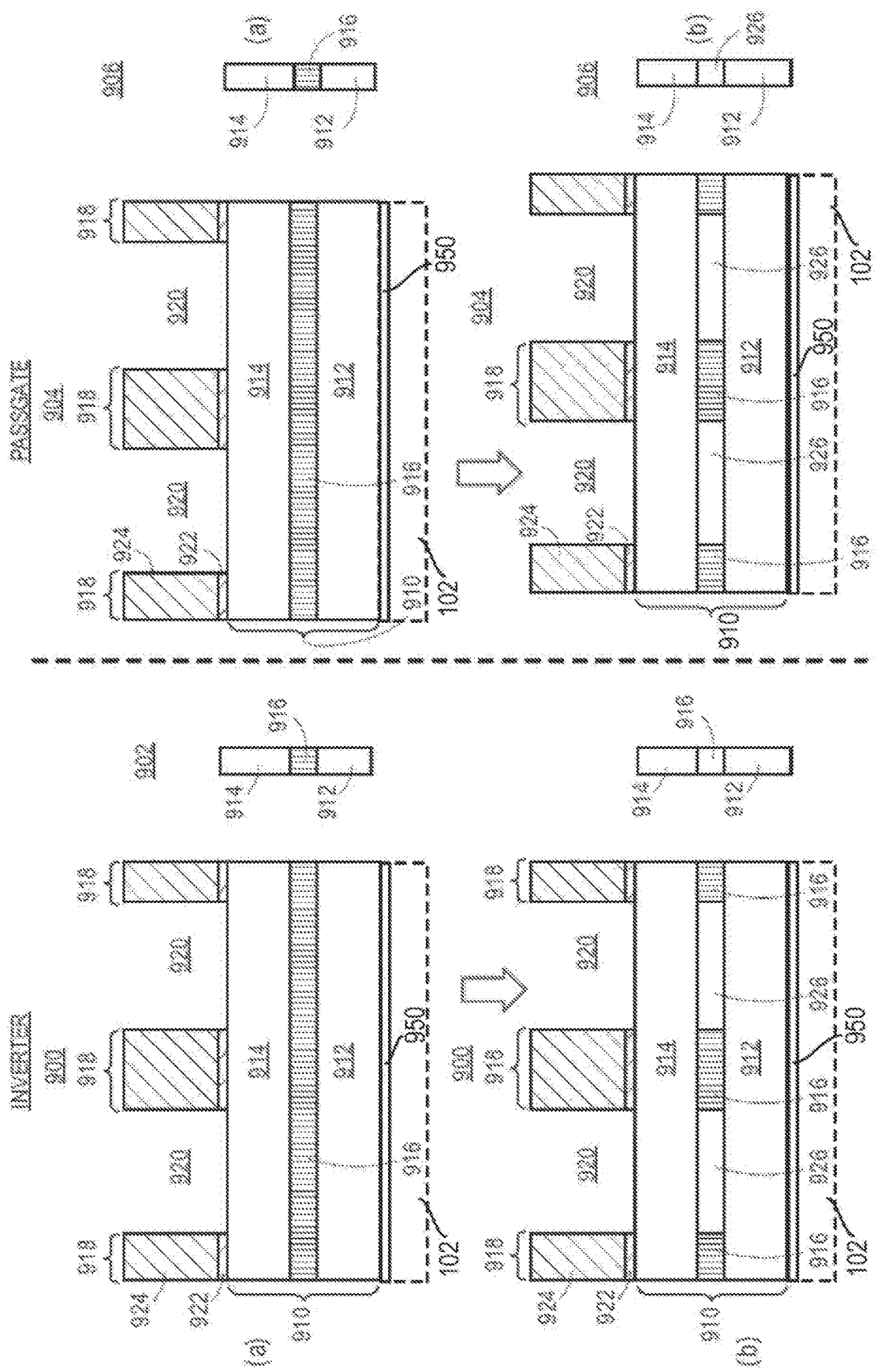
FIGS. 9-20 are cross-sectional views of various stages in the manufacture of an inverter circuit element (left hand side of each of FIGS. 9-20) and a pass gate circuit element (right hand side of each of FIGS. 9-20), including the stacked channel structure of FIG. 1, in accordance with various embodiments.

Referring to FIG. 9, 900 is a cross-sectional view taken through the gate structures and along the fin structure, and 902 is a cross-sectional view taken through a source/drain region of the fin structure, subsequent to an operation in the manufacture of an inverter circuit element. 904 is a cross-sectional view taken through the gate structures and along the fin structure, and 906 is a cross-sectional view taken through a source/drain region of the fin structure, subsequent to an operation in the manufacture of a pass gate circuit element.

Referring to part (a) of FIG. 9, a semiconductor fin 910 includes a lower layer 912 and an upper layer 914. The lower layer 912 is separated from the upper layer 914 by a layer 916. The layer 916 may be a strained sacrificial epitaxial layer (e.g., SiGe with a high germanium content) or a crystalline insulator (e.g., YSZ), as discussed above with reference to FIG. 1. A layer 950 may be disposed between the lower layer 912 and a semiconductor substrate 102 (which may take the form of any of the semiconductor substrates 102 discussed above with reference to the stacked semiconductor structure 100). In some embodiments, the layer 950 may be a strained sacrificial epitaxial layer or a crystalline insulator, as discussed above with reference to FIG. 1. When the layer 950 is a strained sacrificial epitaxial layer, it may be removed at any suitable stage of manufacture (e.g., and replaced with an oxide or nitride insulator to form the first insulator 108 of the stacked channel structure 100).

The lower layer 912 may take any of the forms of the strained first channel 104 discussed herein, while the upper layer 914 may take any of the forms of the strained second channel 106 discussed herein. In particular, the lower layer 912 and the upper layer 914 may be strained (e.g., either under compression or tension) due to lattice mismatch with the semiconductor substrate 102 so that channels formed from the lower layer 912 and the upper layer 914 (as discussed further below) will be strained for appropriate mobility improvement, as discussed above. In particular, when the first layer 912 is to form the first channel 104 of an N-type transistor and the second layer 914 is to form the second channel 106 of a P-type transistor (as discussed above with reference to the inverter of FIG. 2), the first layer 912 may be under tension (e.g., having a first lattice constant less than the substrate lattice constant of the semiconductor substrate 102) and the second layer 914 may be under compression (e.g., having a second lattice constant greater than the substrate lattice constant of the semiconductor substrate 102). In embodiments in which the first layer 912 is a form of the first channel 104 of an N-type transistor and the second layer 914 is to form the second channel 106 of an N-type transistor (as discussed above with reference to the pass gate of FIG. 3), the first layer 912 may be under tension (e.g., having a first lattice constant less than the substrate lattice constant of the semiconductor substrate 102) and the second layer 914 may be under tension (e.g., having a second lattice constant less than the substrate lattice constant of the semiconductor substrate 102).

A plurality of dummy gate structures 918 is formed over the semiconductor fin 910, with source/drain locations 920 between each of the plurality of dummy gate structures 918. Each of the plurality of dummy gate structures 918 may include a dummy gate dielectric layer 922 and a dummy gate electrode 924, as is depicted in FIG. 9.

Semiconductor fin 910 formation may begin with a starting structure of blanket layers that is then etched to provide a fin structure. A shallow trench isolation oxide may be formed adjacent to lower regions of the etched fin stack. The plurality of dummy gate structures 918 may form a grid pattern into and out of the page, and the patterning may involve pitch halving or pitch quartering patterning. Additionally, it is to be appreciated that the plurality of dummy gate structures 918 extends from the top of the upper layer 914 of the semiconductor fin 910 (as shown) and further wraps the upper layer 914, the lower layer 912, and the layer 916 of the semiconductor fin 910 at locations into and out of the page with respect to the perspective shown in 900 and 904.

Referring to part (b) of FIG. 9, regions 926 of the layer 916 of the semiconductor fin 910 are removed. The regions 926 correspond with source/drain locations 920. The regions 926 of the layer 916 of the semiconductor fin 910 may be removed using an etch process selective against etching of the material of the layers 912 and 914. For example, when the upper layer 914 is formed of SiGe, the regions 926 of the layer 916 may be formed from SiGe having a higher germanium content than the SiGe of the upper layer 914. In embodiments in which the layer 916 includes a crystalline insulator, the crystalline insulator may only be included in a layer 916 in regions that are not the regions 926; in the regions 926, the layer 916 may include a sacrificial epitaxial layer (e.g., SiGe with a high Ge content).

Figure 10:
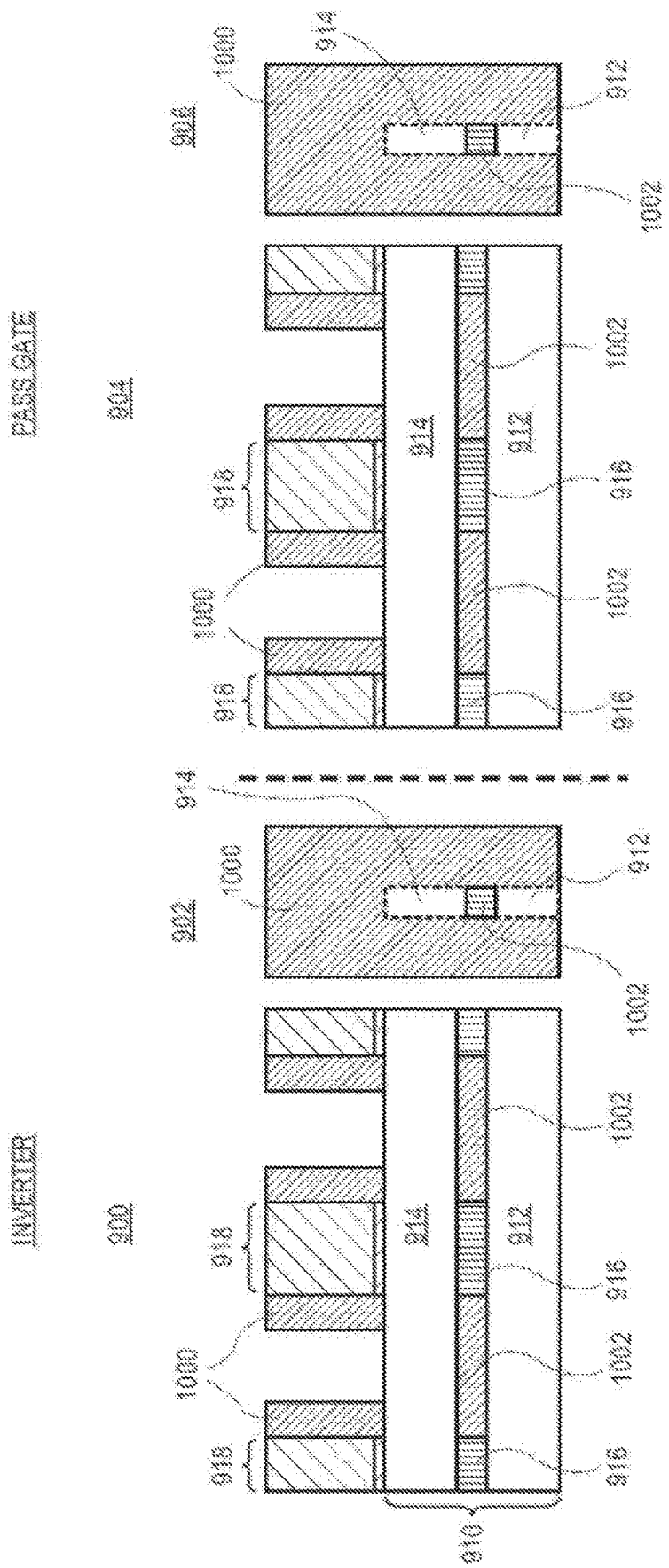

Referring to FIG. 10, dielectric spacers 1000 are formed adjacent the sidewalls of each of the plurality of dummy gate structures 918. The dielectric spacers 1000 may be fabricated by first forming a conformal dielectric layer on the structure of part (b) of FIG. 9 and then anisotropically etching the conformal dielectric layer. In an embodiment, the dielectric material remains in the removed regions 926 of the layer 916 to form dielectric regions 1002, as is depicted in FIG. 10. The semiconductor substrate 102 and the layer 950 are omitted from FIGS. 10-19 for ease of illustration.

Figure 11:
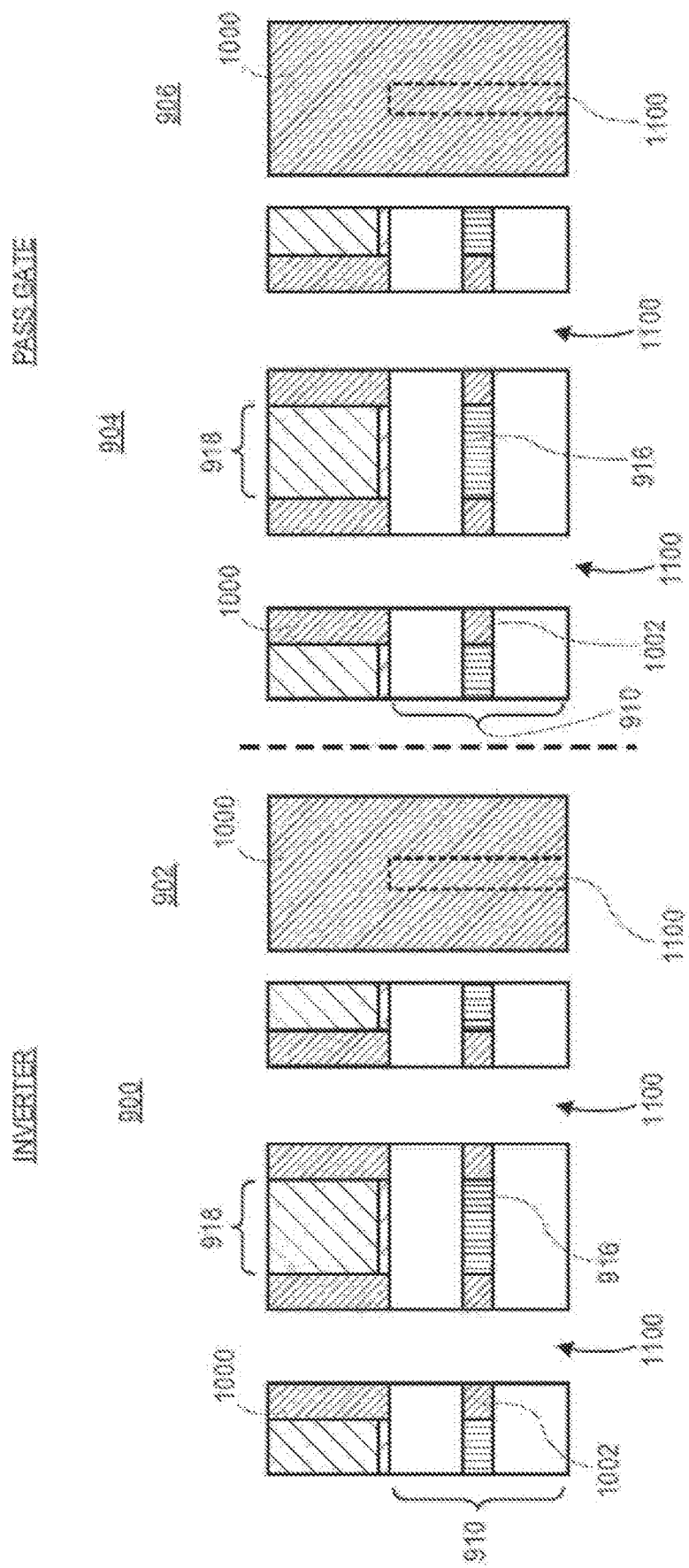

Referring to FIG. 11, a vertical undercut etch is performed to remove portions of the semiconductor fin 910 from the source/drain locations 920 to form undercut regions 1100. The width of the undercut feature may depend on whether N-type or P-type semiconductor regions will ultimately be formed in the undercut regions 1100.

Figure 12:
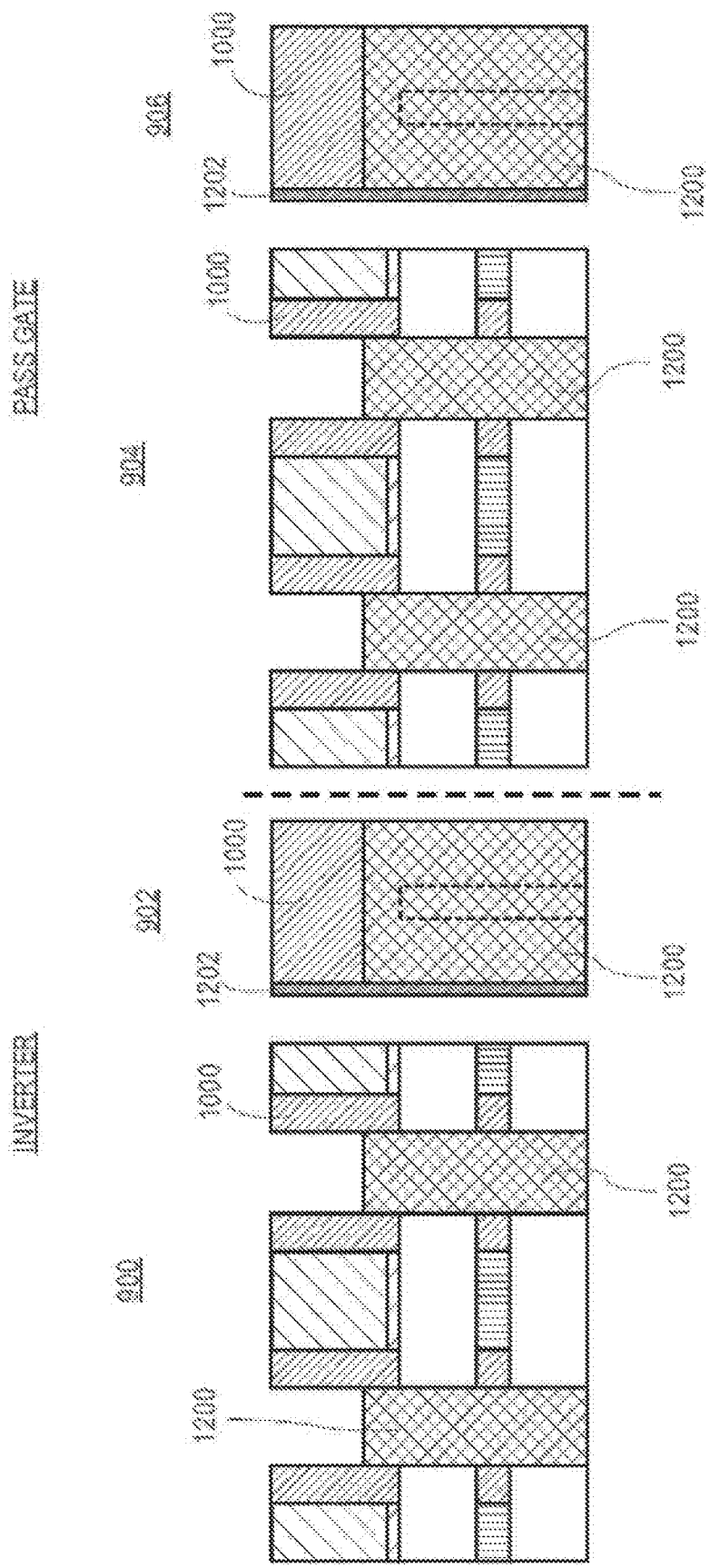

Referring to FIG. 12, epitaxial semiconductor regions 1200 are formed in the undercut regions 1100 of the structure of FIG. 11. The epitaxial regions may be N-type (such as N-type silicon) or P-type (such as P-type silicon germanium) regions, depending on the structural arrangement required (as discussed above). It is to be appreciated that growth from fin to fin may be restricted by an isolation wall 1202, in some embodiments.

Figure 13:
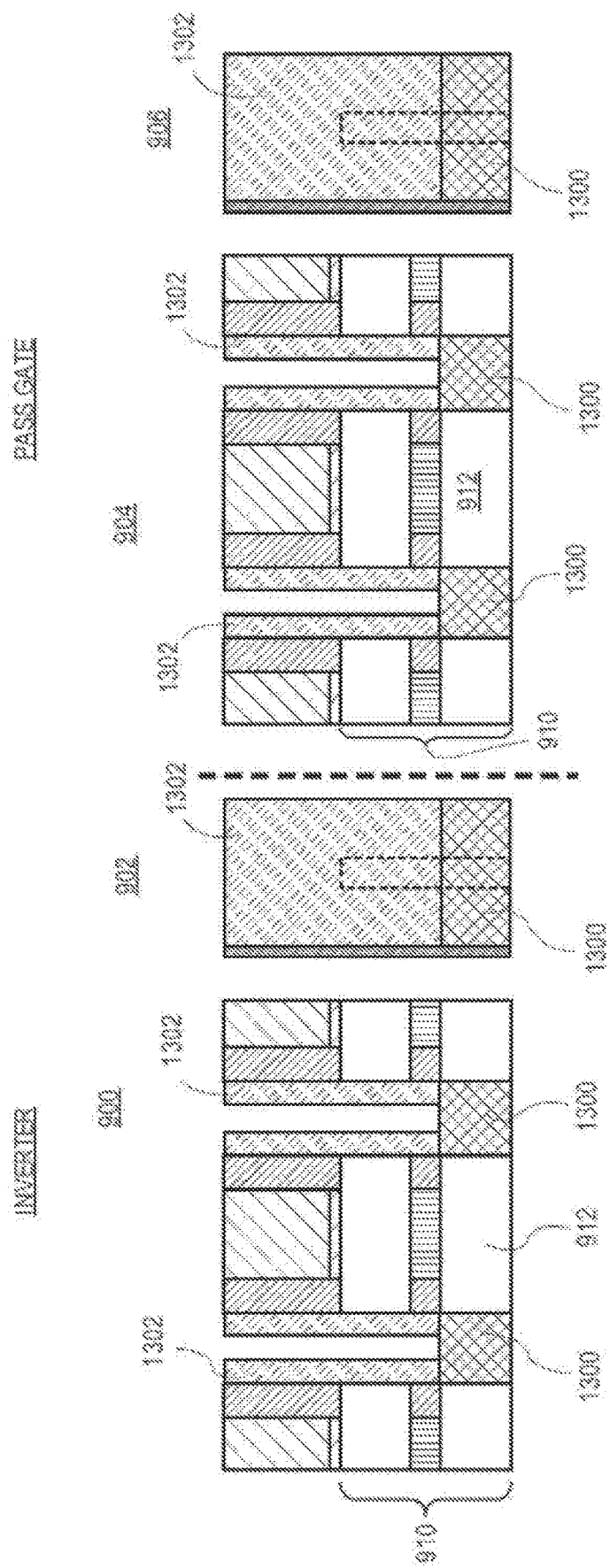

Referring to FIG. 13, the epitaxial semiconductor regions 1200 of the structure of FIG. 12 are etched back to form lower epitaxial source/drain regions 1300. Subsequently, dielectric spacers 1302 are formed above the lower epitaxial source/drain regions 1300. In an embodiment, the lower epitaxial source/drain regions 1300 are formed to a height at or below the height of the lower layer 912 of the semiconductor fin 910. In particular, the layer 916 may serve as a marker layer. The dielectric spacers 1302 may be sacrificial and may be used for ultimate fabrication of a self-aligned contact, as is described below. The remainder of the lower layer 912 will provide the first channel 104 of the stacked channel structure 100.

Figure 14:
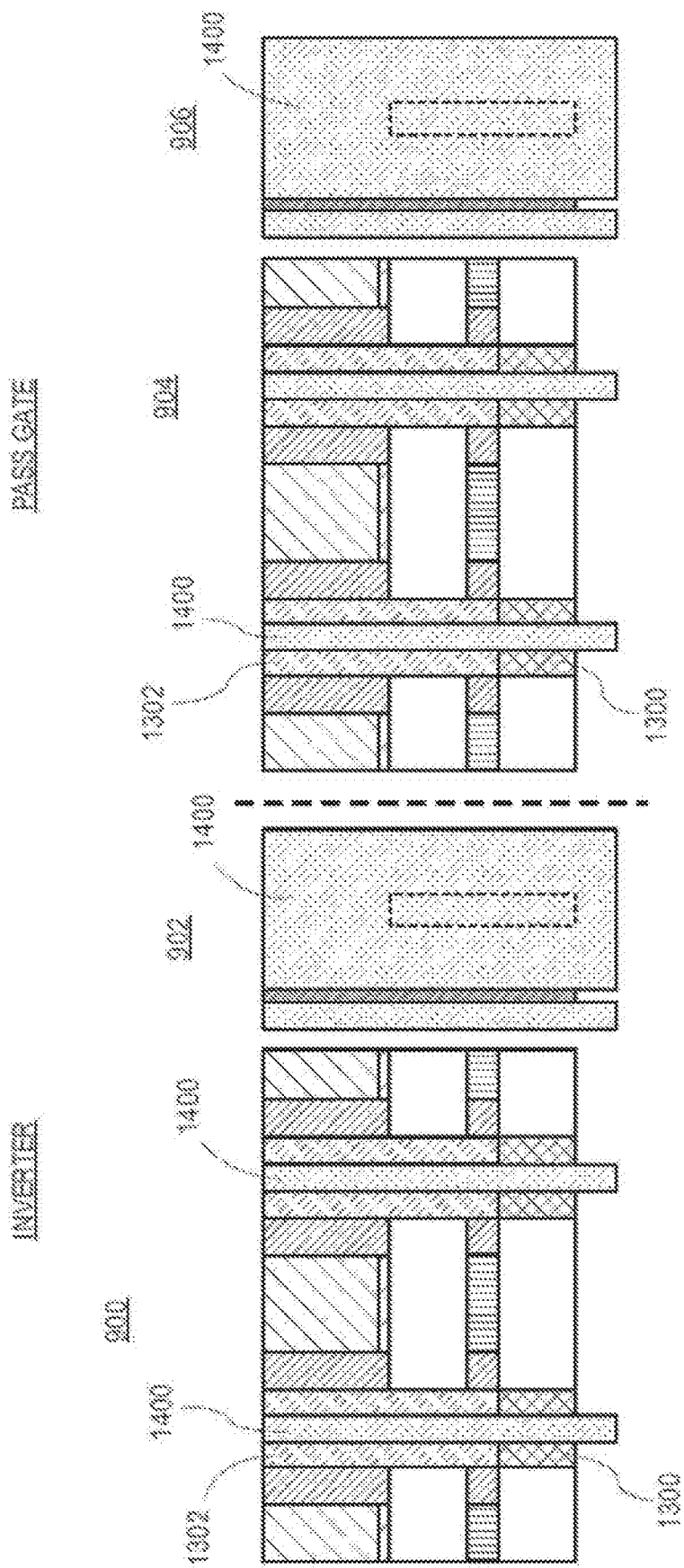

Referring to FIG. 14, trench contacts 1400 are formed into the lower epitaxial source/drain regions 1300 of the structure of FIG. 13 and within the dielectric spacers 1302. In an embodiment, the trench contacts 1400 ultimately provide contact to a lower transistor fabricated for the lower portion 912 of the semiconductor fin 910 (e.g., the first transistor discussed above with reference to the stacked channel structure 100).

Figure 15:
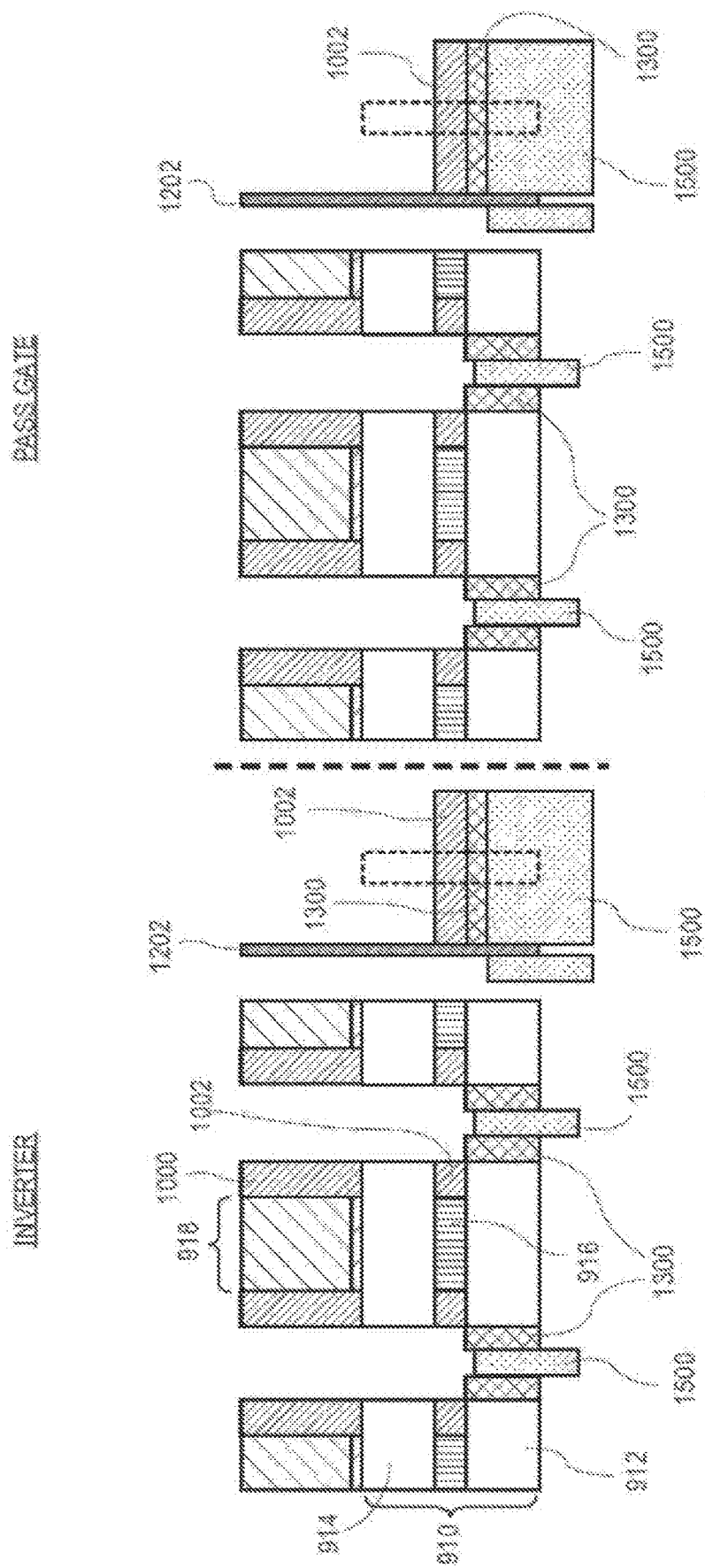

Referring to FIG. 15, the trench contacts 1400 of the structure of FIG. 14 are recessed to provide lower contacts 1500. Also, the dielectric spacers 1302 may be removed at this stage, as is depicted in FIG. 15.

Figure 16:
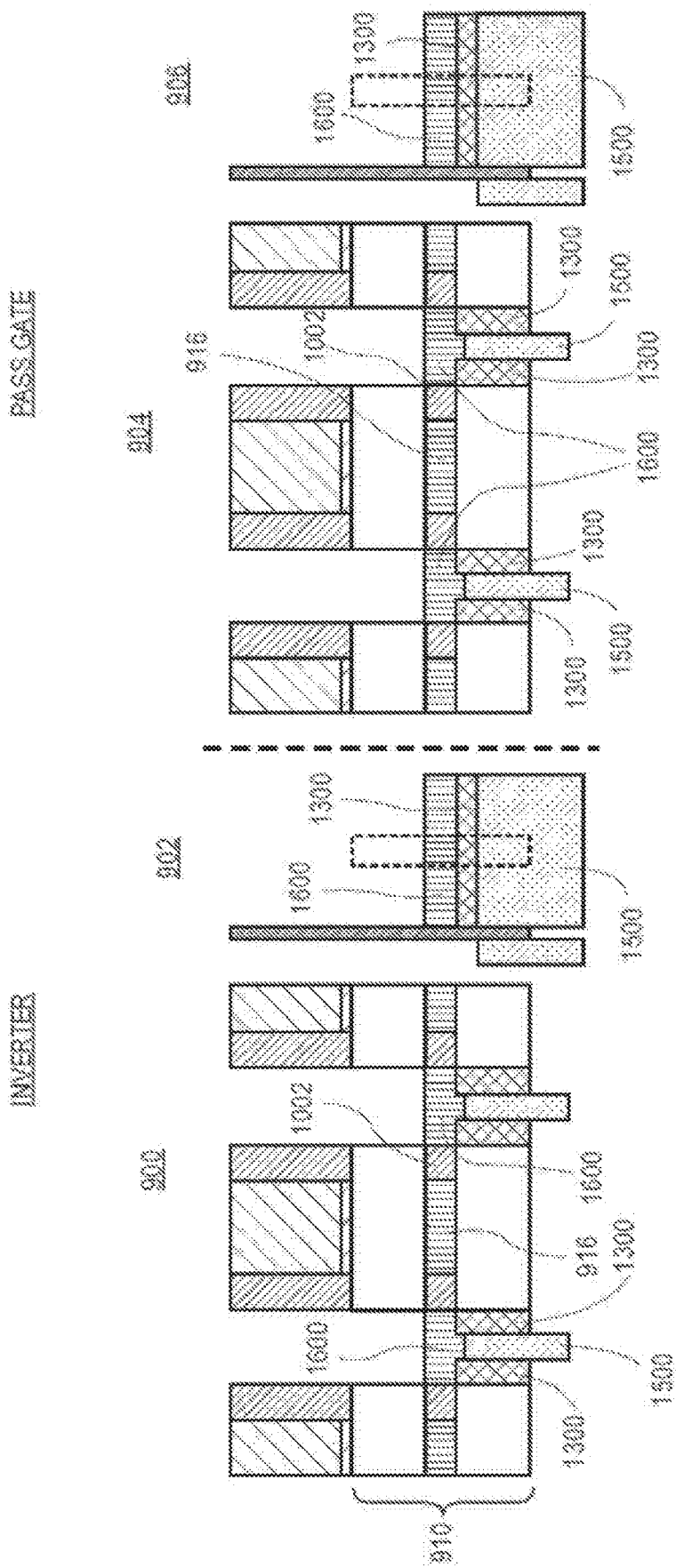

Referring to FIG. 16, an isolation oxide layer 1600 is then formed on the lower contacts 1500 and the lower epitaxial source/drain regions 1300 of the structure of FIG. 15. In an embodiment, the isolation oxide layer 1600 is formed using an oxide fill, recess and wet clean processing scheme. In an embodiment, the top of the isolation oxide layer 1600 is approximately at the same level as the top of the layer 916 of the semiconductor fin 910. In an embodiment, the isolation oxide layer 1600 is ultimately used to isolate corresponding bottom and top transistors (e.g., the first and second transistors, respectively, discussed above with reference to the stacked channel structure 100).

Figure 17:
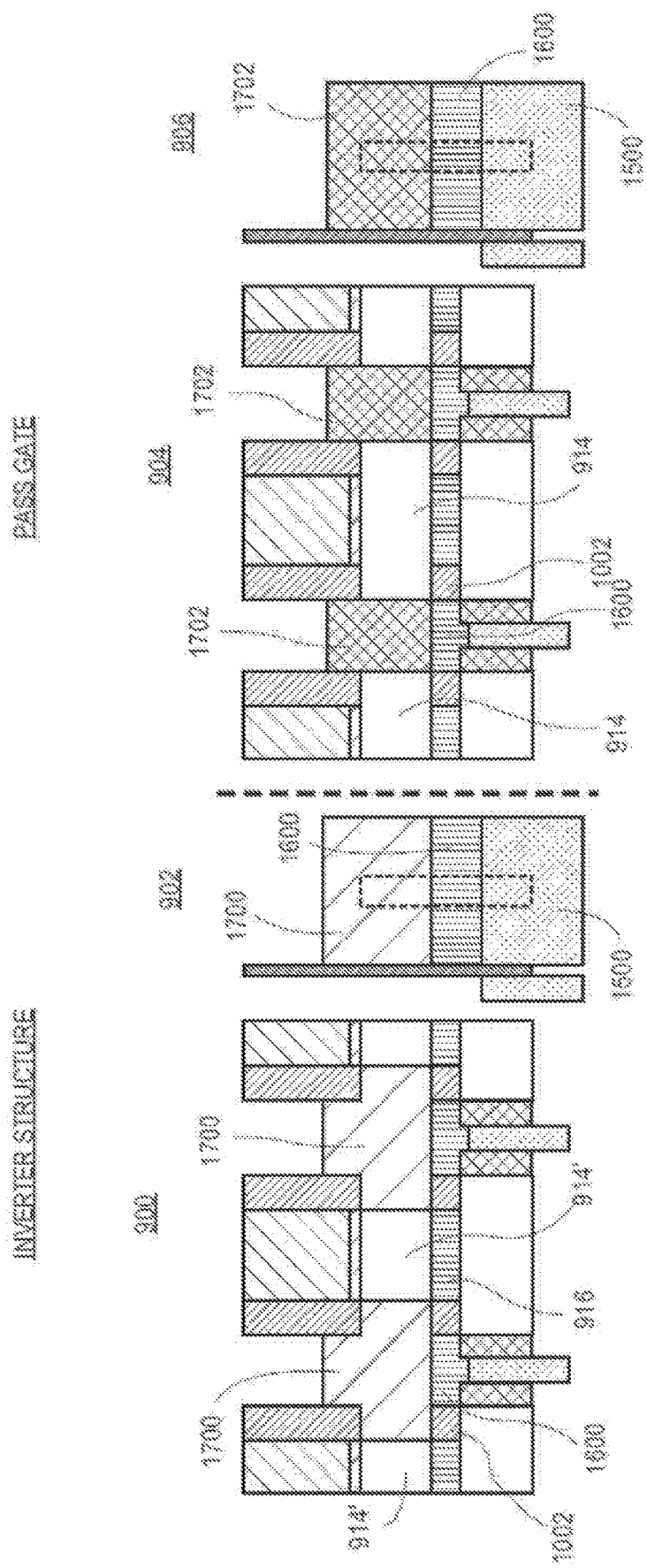

Referring to the inverter structure portion of FIG. 17, the upper layer 914 is undercut with lateral recesses. The upper layer 914 will provide the second channel 106 of the stacked channel structure 100. Epitaxial growth of upper source/drain regions 1700 is then performed. In other embodiments, the upper layer 914 may not be undercut prior to epitaxial growth of the upper source/drain regions 1700. Instead, the area between the dielectric spacers 1302 may be implanted or in-diffused with a dopant for the upper source/drain regions 1700, and then the remainder of the upper source/drain regions 1700 may be formed by epitaxial growth. The "undercut and fill" areas of source/drain material illustrated in FIG. 17 may provide lateral pressure on the sides of the upper layer portion 914', providing further compressive stress to the upper layer 914. When the upper layer portion 914' is the channel of a PMOS device, this additional compressive stress may improve hole mobility, as discussed above. However, the stacked channel structures 100 disclosed herein may cause enough compressive stress within the upper layer 914 (by virtue of the lattice mismatches in the stack) that no "undercut and fill" areas are required. Omitting these "undercut and fill areas" (which may be referred to as "stressor regions") may reduce the volume of the device, and improve the area scaling.

As discussed above with reference to FIG. 2, the lower transistor of the inverter structure (the first transistor as discussed above with reference to FIG. 1) is an NMOS device and the lower epitaxial source/drain regions 1300 are N-type, such as N-type silicon regions. The lower layer 912 (which will provide the first channel 104 of the stacked channel structure 100) may be under tension to improve electron mobility, as discussed above. In that embodiment, the upper transistor of the inverter structure (the second transistors discussed above with reference to FIG. 1) is a PMOS device and the upper epitaxial source/drain regions 1700 are P-type, such as P-type silicon germanium regions, as is depicted in FIG. 17. The upper layer 914 (which will provide the second channel 106 of the stacked channel structure 100) may be under compression to improve hole mobility, as discussed above.

Referring to the pass gate portion of FIG. 17, epitaxial growth of upper source/drain regions 1702 is performed. In an embodiment, the lower transistor of the pass gate structure (the first transistor as discussed above with reference to FIG. 1) is an NMOS device and the lower epitaxial source/drain regions 1300 are N-type, such as N-type silicon regions. The lower layer 912 (which will provide the first channel 104 of the stacked channel structure 100) may be under tension to improve electron mobility, as discussed above. In that embodiment, the upper transistor of the pass gate structure (the second transistor discussed above with reference to FIG. 1) is also an NMOS device and the upper epitaxial source/drain regions 1700 are N-type, such as N-type silicon regions, as is depicted in FIG. 17. The upper layer 914 (which will provide the second channel 106 of the stacked channel structure 100) may be under tension to improve electron mobility, as discussed above.

Figure 18:
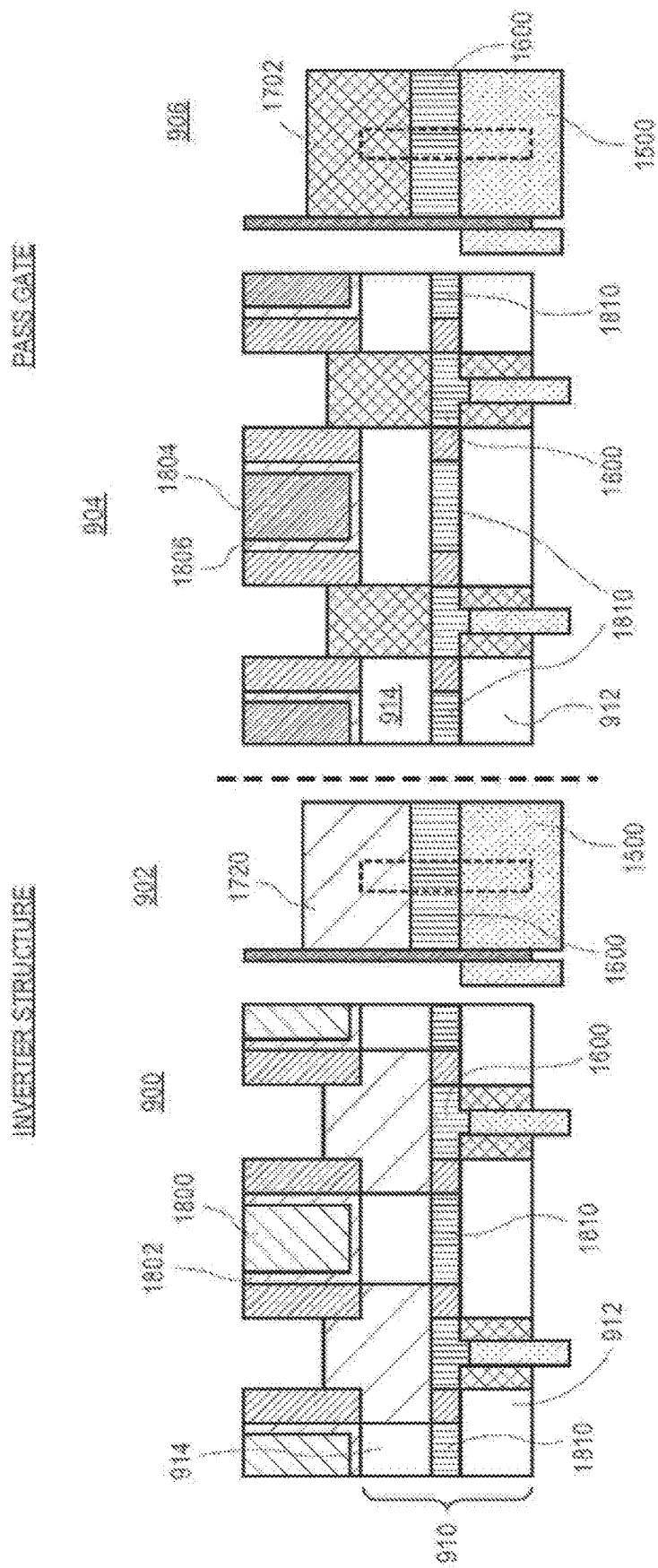

Referring to FIG. 18, a replacement gate process is then performed. For example, for the inverter structure, metal gate 1800 and high-k gate dielectric 1802 layers may be formed in place of the dummy gate structures 918. Likewise, for the pass gate structure, metal gate 1804 and high-k gate dielectric 1806 layers may be formed in place of the dummy gate structures 918.

In an embodiment, the replacement gate process is performed by forming an interlayer dielectric layer on the structure of FIG. 17. Such an interlayer dielectric layer may then be polished down to expose a polysilicon layer (dummy gate electrode 924) for removal. During this stage, when the layer 916 includes a sacrificial material (e.g., sacrificial SiGe, as discussed above with reference to FIG. 9), the remaining portions of the layer 916 are removed and replaced with an insulator 1810, as is depicted in FIG. 18. The insulator 1810 may provide the second insulator 110 of the stacked channel structure 100. The insulator 1810, which may include an oxide or nitride fill material, ultimately isolates bottom and top transistors. In embodiments in which the layer 916 includes a "permanent" insulator, such as any of the crystalline insulators discussed above with reference to FIG. 1, the layer 916 may remain without being removed.

Subsequently, the lower transistor gate stack is formed within the trench formed upon removal of the dummy gate stack, which may involve deposition and recessing of gate materials to a level approximately at the level of the lower layer 912, on either side of the semiconductor fin 910 (i.e., into and out of the page of the perspective shown in FIG. 18).

A top transistor gate material stack may then be formed above the lower transistor gate material stack. In an embodiment, in the case of the inverter structure, the top transistor gate material stack is of an opposite conductivity type than that of the lower transistor gate material stack. In another embodiment, in the case of the pass gate structure, the top transistor gate material stack is of a same conductivity type as that of the lower transistor gate material stack. In either case, in an embodiment, within a same gate trench, an isolation layer is formed between the lower transistor gate material stack and the top transistor gate material stack. A portion of the top transistor gate stack is shown as 1800/1802 for the inverter structure and as 1804/1806 for the pass gate structure. It is to be appreciated that additional portions of the top transistor gate stack are also formed to a level approximately at the lower level of the upper layer 914, on either side of the semiconductor fin 910 (i.e., into and out of the page of the perspective shown in FIG. 18.)

Figure 19:
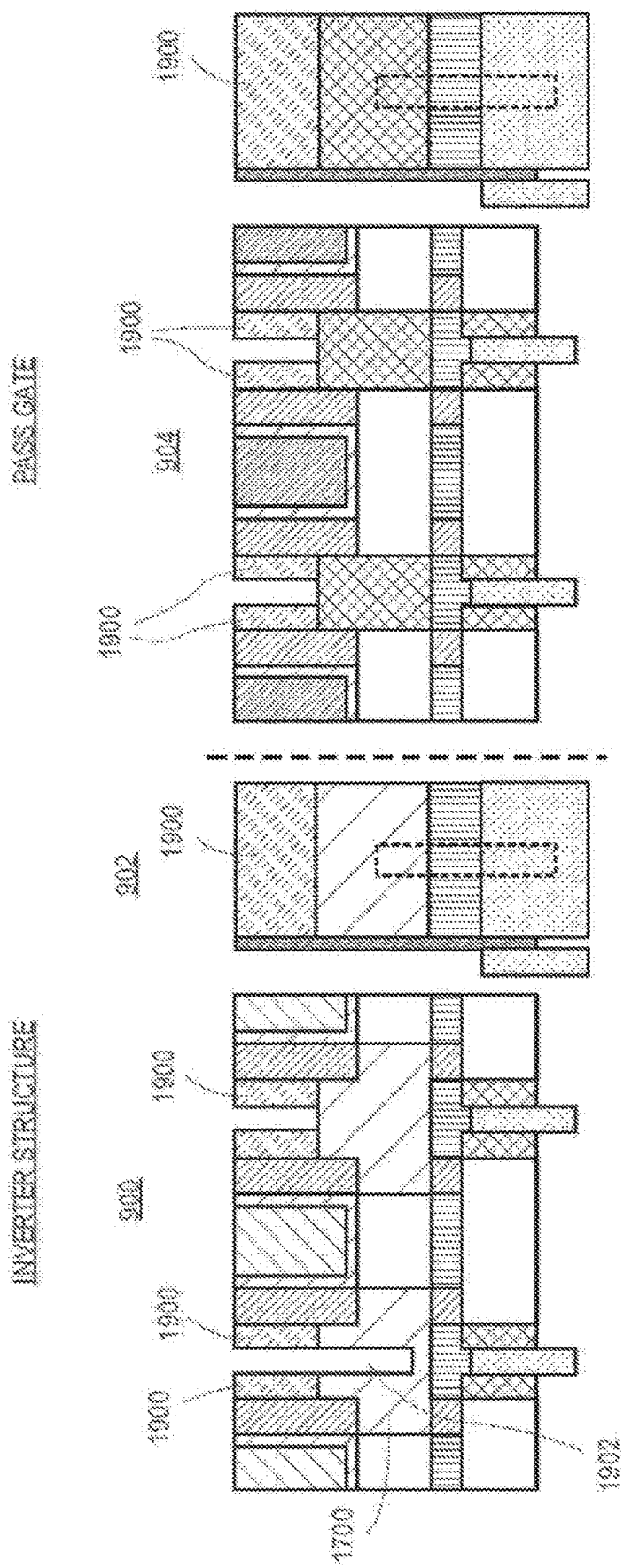

Referring to FIG. 19, a dielectric spacer 1900 is then formed. Dielectric spacer 1900 may be formed by first depositing a blanket film followed by contact lithography to open areas where top and bottom transistors are to be connected. A spacer dry etch may then be performed to form dielectric spacers 1900. Additionally, in select locations, epitaxial semiconductor dry etch (e.g., for one of the regions 1700) may then be performed to extend contact region 1902 where a top and bottom transistor are to be electrically connected.

Figure 20:
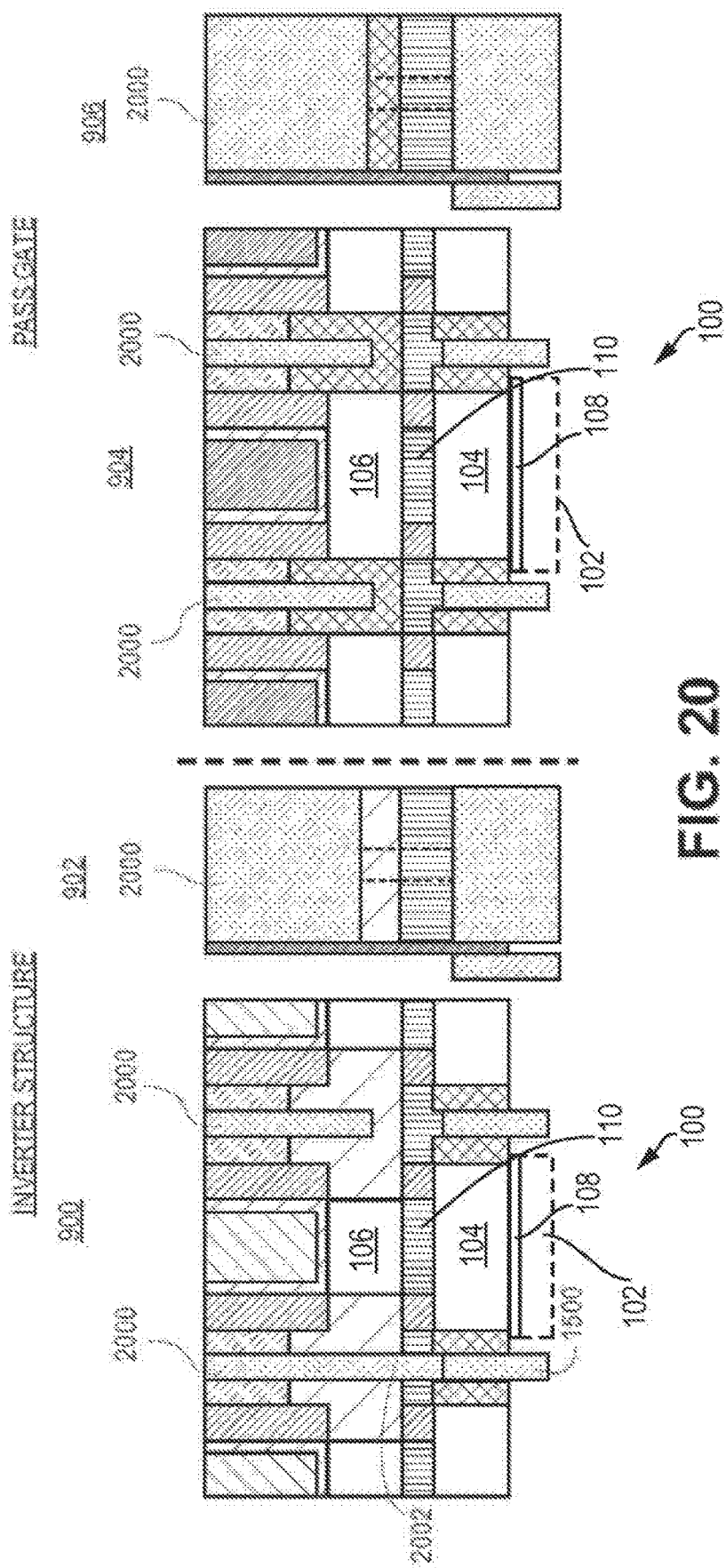

Referring to FIG. 20, upper contacts 2000 are then formed. In one embodiment, one contact 2002 of the upper contacts is electrically connected to one of the lower contacts 1500, as is the case for the inverter structure of FIG. 20. The upper contacts may be fabricated by stripping a photoresist, followed by a blanket contact etch fabrication scheme to form required source/drain connections between top and bottom transistors. As shown in FIG. 20, the inverter structure and the pass gate structure may each include a stacked channel structure 100 having a semiconductor substrate 102, a first channel 104, a second channel 106, a first insulator 108, and a second insulator 110.

Similarly, NAND gate fabrication using two fins can be formed by connecting two parallel PMOS on fin1 (e.g., FIGS. 6A and 6B) and two serial NMOS on fin2 (e.g., FIGS. 7A and 7B). It is to be appreciated that the parallel PMOS have separate source/drain with no connection between top and bottom transistors. In an embodiment, serial NMOS can be formed by one source/drain (either on left or right) connected between top and bottom transistors and the other source/drain isolated between top and bottom.

In an embodiment, NOR gate architecture can be formed like NAND gate architecture by processing parallel NMOS transistors and serial PMOS transistors. Other elements of logic gates, or random logic and some elements of sequential logic can also be combined and made vertically on a single fin, using process steps mentioned above. Furthermore, combining this approach with routing tracks underneath the devices can yield complex gates in small areas. Additionally, total drive of the circuit elements can be increased by using multiple fins.

FIG. 21 is a flow diagram of a method 2100 of manufacturing a stacked channel structure, in accordance with various embodiments. Although various operations are arranged in particular order and illustrated once each, various ones of the operations may be repeated or performed in any suitable order.

At 2102, a semiconductor substrate (e.g., the semiconductor substrate 102) may be provided. The semiconductor substrate of 2102 may have a substrate lattice constant. In some embodiments, the semiconductor substrate of 2102 may take the form of any of the semiconductor substrates 102 discussed herein with reference to the stacked channel structure 100.

At 2104, a first intermediate layer may be provided on the semiconductor substrate of 2102. In some embodiments, the first intermediate layer may be a crystalline insulator, such as YSZ. In some embodiments, the first intermediate layer may be a sacrificial layer, such as an epitaxially deposited layer of SiGe. The first intermediate layer may be selected and deposited such that the lattice structure of the semiconductor substrate of 2102 may be matched by the material of the first intermediate layer. In some embodiments, the first intermediate layer may be provided at 2104 via epitaxy. In some embodiments, the first intermediate layer may take the form of any of the first insulators 108 discussed herein with reference to the stacked channel structure 100, or any of the sacrificial layers that may be replaced by the first insulator 108 in the stacked channel structure 100.

At 2106, a first channel material may be provided on the first intermediate layer of 2104. The first channel material may have a first lattice constant different from the substrate lattice constant. The atoms of the first channel material may move farther apart or closer together to match the lattice structure of the first intermediate layer (which itself matches the lattice structure of the semiconductor substrate). In some embodiments, the first channel material may be provided at 2106 via epitaxy. In some embodiments, the first channel material of 2106 may take the form of any of the first channels 104 discussed herein with reference to the stacked channel structure 100.

At 2108, a second intermediate layer may be provided on the first channel material of 2106. In some embodiments, the second intermediate layer may be a crystalline insulator, such as YSZ. In some embodiments, the second intermediate layer may be a sacrificial layer, such as an epitaxially deposited layer of SiGe. The second intermediate layer may be selected and deposited, such as the lattice structure of the first channel material of 2106 may be matched by the material of the second intermediate layer. In some embodiments, the second intermediate layer may be provided at 2108 via epitaxy. In some embodiments, the second intermediate layer may take the form of any of the first insulators 108 discussed herein with reference to the stacked channel structure 100, or any of the sacrificial layers that may be replaced by the first insulator 108 in the stacked channel structure 100.

At 2110, a second channel material may be provided on the second intermediate layer. The second channel material may have a second lattice constant different from the substrate lattice constant. The atoms of the second channel material may move farther apart or closer together to match the lattice structure of the second intermediate layer (which itself matches the lattice structure of the semiconductor substrate via the first intermediate layer and the first channel material). In some embodiments, the second channel material may be provided at 2110 via epitaxy. In some embodiments, the second channel material of 2110 may take the form of any of the second channels 106 discussed herein with reference to the stacked channel structure 100.

At 2112, a fin may be formed extending away from the semiconductor substrate of 2102. The first channel material of 2106 may be disposed in a lower region of the fin and the second channel material of 2110 may be disposed in an upper region of the fin.

In some embodiments, the first channel material of 2106 may include SiGe, and the first intermediate layer of 2104 (or the second intermediate layer of 2108) may be a sacrificial SiGe layer having a germanium content greater than a germanium content of the first channel material. In some such embodiments, the method 2100 may further include selectively removing a portion of the sacrificial SiGe layer. In some such embodiments, the method 2100 may further include providing a nitride or oxide in place of the portion of the sacrificial SiGe layer. In some embodiments, the method 2100 may further include etching the second channel material and then forming S/D regions by implanting or in-diffusing a dopant into the second channel material. In some embodiments, the method 2100 may further include any of the manufacturing operations discussed herein with reference to FIGS. 9-20.

Figure 22:
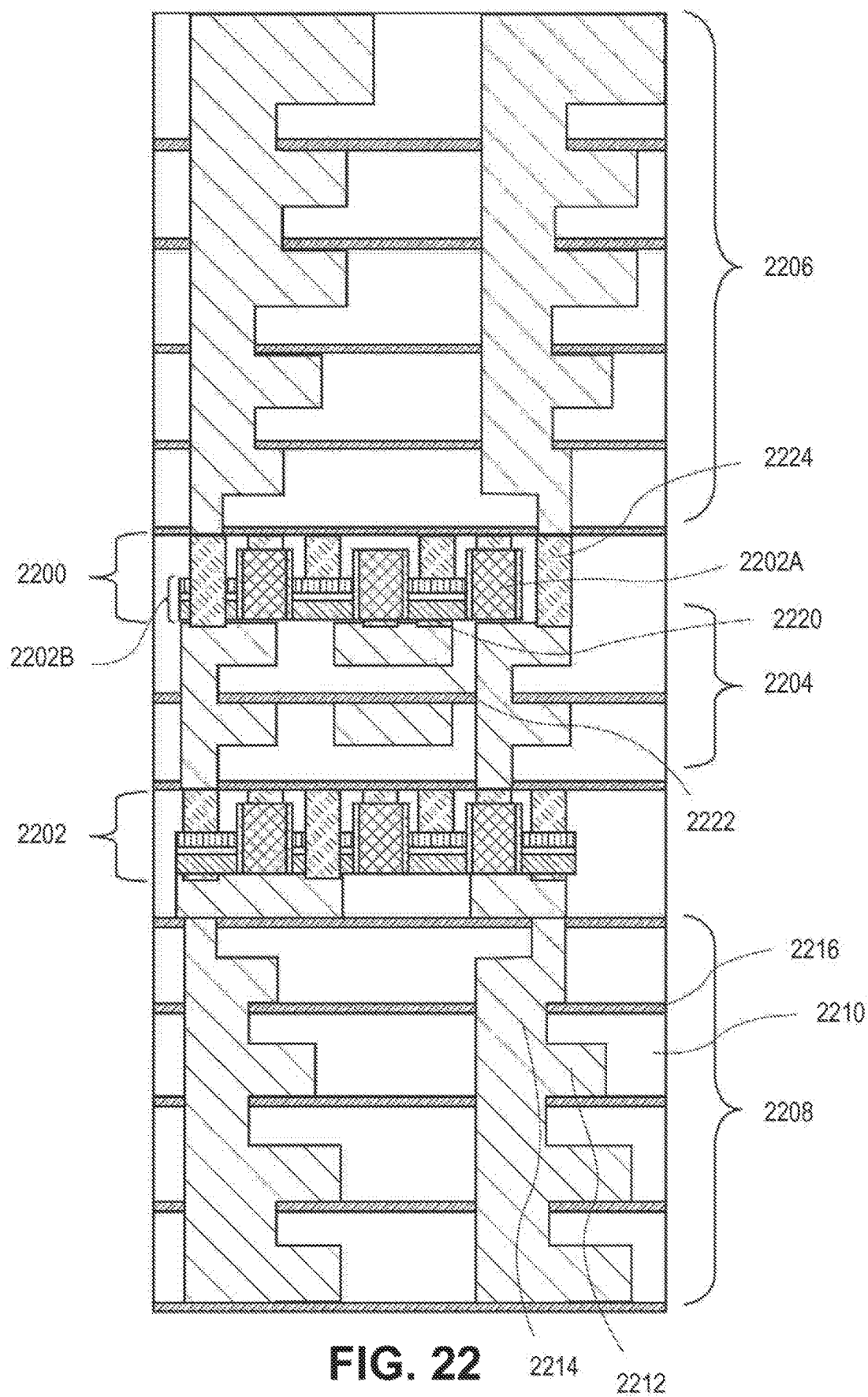
FIG. 22 is a cross-sectional view of vertically integrated single fin elements including the stacked channel structure of FIG. 1 and having interconnect wiring between device layers, in accordance with various embodiments.

In an embodiment, total chip area scaling can be further enhanced by integrating more than two transistors vertically either by extending the above technique, or using layer transfer techniques. In an example, FIG. 22 is a cross-sectional view of vertically integrated single fin elements including the stacked channel structure of FIG. 1 and having interconnect wiring between device layers, in accordance with various embodiments. Referring to FIG. 22, a first device layer 2200 and second device layer 2202 (e.g., with gates 2202A and fins 2202B) are vertical structures such as those described above. One or more metallization layers 2204 are between device layers, one or more metallization layers 2206 are above the device layers, and one or more metallization layers 2208 are below the device layers. Each metallization layer may include an interlayer dielectric (ILD) layer 2210, metal lines 2212, vias 2214, and an etch stop layer 2216. Particular routing may include contact 2220 to S/D, contact 2222 to gate, and backside to front side via 2224. In some embodiments, such an architecture can be fabricated using a layer transfer technique.

The stacked channel structures disclosed herein may be included in any suitable IC device, which may in turn be included in any suitable computing device. FIGS. 23-26 illustrate various examples of apparatuses that may include any of the stacked channel structures disclosed herein. Similarly, the methods disclosed herein may be used in any suitable stage in the manufacture of an apparatus as discussed below with reference to FIGS. 23-26.

FIGS. 23A-B are top views of a wafer 2300 and dies 2302 that may include the stacked channel structure 100 (not shown) in accordance with any of the embodiments disclosed herein. The stacked channel structure 100 may be one of multiple IC structures formed on the wafer 2300. The wafer 2300 may be composed of semiconductor material and may include one or more dies 2302 having IC structures formed on a surface of the wafer 2300. In some embodiments, the IC structures included in a die 2302 may be an embodiment of the vertically integrated single fin elements discussed above with reference to FIG. 22, or any of the circuit elements discussed above with reference to FIGS. 2-8. Each of the dies 2302 may be a repeating unit of a semiconductor product that includes one or more of the stacked channel structures 100. After the fabrication of the semiconductor product is complete (e.g., including the operations discussed above with reference to FIGS. 9-21), the wafer 2300 may undergo a singulation process in which each of the dies 2302 is separated from one another to provide discrete "chips" of the semiconductor product. Thus, the stacked channel structure 100 may be present in the wafer 2300 due to its presence in the dies 2302. In particular, the stacked channel structure 100 may be included in an apparatus that takes the form of the wafer 2300 (e.g., not singulated) or the form of the die 2302 (e.g., singulated). As discussed above, the stacked channel structure 100 may be part of a multi-transistor structure included in the die 2302. In addition to the stacked channel structure 100, and the associated transistors, that die 2302 may include one or more other transistors (e.g., some of the transistor(s) 2440 of FIG. 24, discussed below) and/or supporting circuitry to route electrical signals to the one or more multi-transistor structure, as well as any other IC components.

In some embodiments, the stacked channel structure 100 may be included in a memory device (e.g., an SRAM device), a logic device (e.g., an AND, OR, NAND, or NOR gate, as discussed above), or any other suitable circuit element. Multiple ones of these devices may be combined on a single die 2302. For example, a memory array formed by multiple memory devices may be formed on a same die 2302 as a processing device (e.g., the processing device 2602 of FIG. 26) or other logic that is configured to store information in the memory devices or execute instructions stored in the memory array; any one or more of these devices may include one or more of the stacked channel structures 100.

FIG. 24 is a cross-sectional side view of an IC device 2400 that may include a stacked channel structure 100 in accordance with any of the embodiments disclosed herein. The IC device 2400 may be formed on a substrate 2402 (e.g., the wafer 2300 of FIG. 23A) and may be included in a die (e.g., the die 2302 of FIG. 23B). The substrate 2402 may be a semiconductor substrate composed of semiconductor material systems including, for example, N-type or P-type materials systems. The substrate 2402 may include, for example, a crystalline substrate formed using a bulk silicon or a silicon-on-insulator substructure. In some embodiments, the semiconductor substrate 2402 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2402. Although a few examples of materials from which the substrate 2402 may be formed are described here, any material that may serve as a foundation for an IC device 2400 may be used. The substrate 2402 may be part of a singulated die (e.g., the dies 2302 of FIG. 23B) or a wafer (e.g., the wafer 2300 of FIG. 23A). In some embodiments, the substrate 2402 may provide the semiconductor substrate 102 of the stacked channel structure 100; in other embodiments, the semiconductor substrate 102 of the stacked channel structure 100 may be formed on the substrate 2402.

The IC device 2400 may include one or more device layers 2404 disposed on the substrate 2402. The device layer 2404 may include features of one or more transistors 2440 (e.g., MOSFETs) formed on the substrate 2402. The device layer 2404 may include, for example, one or more source and/or drain (S/D) regions 2420, a gate 2422 to control current flow in transistors 2440 between the S/D regions 2420, and one or more S/D contacts 2424 to route electrical signals to/from the S/D regions 2420. The transistors 2440 may include additional features not depicted for the sake of clarity such as device isolation regions, gate contacts, and the like. The transistors 2440 are not limited to the type and configuration depicted in FIG. 24 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

In particular, although the transistors 2440 illustrated in FIG. 24 are planar transistors, the IC device 2400 may include multi-transistor structures arranged vertically on a fin, as illustrated in FIG. 22, in addition to or instead of planar transistors. Additionally, a computing device (e.g., the computing device 2600 of FIG. 26) may include devices with multiple transistors arranged vertically on a fin, and devices with planar transistors. Any suitable ones of the materials used in the transistors 2440, or processes used to form the transistors 2440, may be used in the multi-transistor structures (including a stacked channel structure 100) disclosed herein. For example, embodiments of various ones of the components of the IC device 2400 may be utilized in the corresponding components of the vertically integrated single fin elements of FIG. 22, or any of the circuit elements discussed above with reference to FIGS. 2-8.

Each transistor 2440 may include a gate 2422 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work function metal or N-type work function metal, depending on whether the transistor 2440 is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides—for example, ruthenium oxide. For an NMOS transistor, metals that may be used for the gate electrode include, but are not limited to, hafnium, zirconium, titanium, tantalum, aluminum, alloys of these metals, and carbides of these metals. such as hafnium carbide, zirconium carbide, titanium carbide, tantalum carbide, and aluminum carbide.

In some embodiments, when viewed as a cross-section of the transistor 2440 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2420 may be formed within the substrate 2402 adjacent to the gate 2422 of each transistor 2440. The S/D regions 2420 may be formed using either an implantation/diffusion process or an etching/deposition process. In the former process, dopants such as boron, aluminum, antimony, phosphorous, or arsenic may be ion-implanted into the substrate 2402 to form the S/D regions 2420. An annealing process that activates the dopants and causes them to diffuse farther into the substrate 2402 may follow the ion implantation process. In the latter process, the substrate 2402 may first be etched to form recesses at the locations of the S/D regions 2420. An epitaxial deposition process may then be carried out to fill the recesses with material that is used to fabricate the S/D regions 2420. In some implementations, the S/D regions 2420 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2420 may be formed using one or more alternate semiconductor materials such as germanium or a group III-V material or alloy. In further embodiments, one or more layers of metal and/or metal alloys may be used to form the S/D regions 2420.

Electrical signals, such as power and/or input/output (I/O) signals, may be routed to and/or from the transistors 2440 of the device layer 2404 through one or more interconnect layers disposed on the device layer 2404 (illustrated in FIG. 24 as interconnect layers 2406-2410). For example, electrically conductive features of the device layer 2404 (e.g., the gate 2422 and the S/D contacts 2424) may be electrically coupled with interconnect structures 2428 of the interconnect layers 2406-2410. The one or more interconnect layers 2406-2410 may form an interlayer dielectric (ILD) stack 2419 of the IC device 2400.

The interconnect structures 2428 may be arranged within the interconnect layers 2406-2410 to route electrical signals according to a wide variety of designs (in particular, the arrangement is not limited to the particular configuration of interconnect structures 2428 depicted in FIG. 24). Although a particular number of interconnect layers 2406-2410 is depicted in FIG. 24, embodiments of the present disclosure include IC devices having more or fewer interconnect layers 2406-1110 than depicted.

In some embodiments, the interconnect structures 2428 may include trench structures 2428a (sometimes referred to as "lines") and/or via structures 2428b (sometimes referred to as "holes") filled with an electrically conductive material such as a metal. The trench structures 2428a may be arranged to route electrical signals in a direction of a plane that is substantially parallel with a surface of the substrate 2402 upon which the device layer 2404 is formed. For example, the trench structures 2428a may route electrical signals in a direction in and out of the page from the perspective of FIG. 24. The via structures 2428b may be arranged to route electrical signals in a direction of a plane that is substantially perpendicular to the surface of the substrate 2402 upon which the device layer 2404 is formed. In some embodiments, the via structures 2428b may electrically couple trench structures 2428a of different interconnect layers 2406-2410 together. In some embodiments, via structure 2428b (e.g., the via 266) may electrically couple a trench structure 2428a to a tantalum hardmask 244 serving as a top contact for an MRAM device 160 in a memory structure 100, as shown in FIG. 24.

The interconnect layers 2406-1110 may include a dielectric material 2426 disposed between the interconnect structures 2428, as shown in FIG. 24. In some embodiments, the dielectric material 2426 disposed between the interconnect structures 2428 in different ones of the interconnect layers 2406-2410 may have different compositions; in other embodiments, the composition of the dielectric material 2426 between different interconnect layers 2406-2410 may be the same.

A first interconnect layer 2406 (referred to as Metal 1 or "M1") may be formed directly on the device layer 2404. In some embodiments, the first interconnect layer 2406 may include trench structures 2428a and/or via structures 2428b, as shown. Trench structures 2428a of the first interconnect layer 2406 may be coupled with contacts (e.g., S/D contacts 2424) of the device layer 2404.

A second interconnect layer 2408 (referred to as Metal 2 or "M2") may be formed directly on the first interconnect layer 2406. In some embodiments, the second interconnect layer 2408 may include via structures 2428b to couple the trench structures 2428a of the second interconnect layer 2408 with the trench structures 2428a of the first interconnect layer 2406. Although the trench structures 2428a and the via structures 2428b are structurally delineated with a line within each interconnect layer (e.g., within the second interconnect layer 2408) for the sake of clarity, the trench structures 2428a and the via structures 2428b may be structurally and/or materially contiguous (e.g., simultaneously filled during a dual-damascene process) in some embodiments.

A third interconnect layer 2410 (referred to as Metal 3 or "M3") (and additional interconnect layers, as desired) may be formed in succession on the second interconnect layer 2408 according to similar techniques and configurations described in connection with the second interconnect layer 2408 on the first interconnect layer 2406.

The IC device 2400 may include a solder resist material 2434 (e.g., polyimide or similar material) and one or more bond pads 2436 formed on the interconnect layers 2406-2410. The bond pads 2436 may be electrically coupled with the interconnect structures 2428 and configured to route the electrical signals of transistor(s) 2440 to other external devices. For example, solder bonds may be formed on the one or more bond pads 2436 to mechanically and/or electrically couple a chip including the IC device 2400 with another component (e.g., a circuit board). The IC device 2400 may have other alternative configurations to route the electrical signals from the interconnect layers 2406-2410 than depicted in other embodiments. For example, the bond pads 2436 may be replaced by or may further include other analogous features (e.g., posts) that route the electrical signals to external components.

Figure 25:
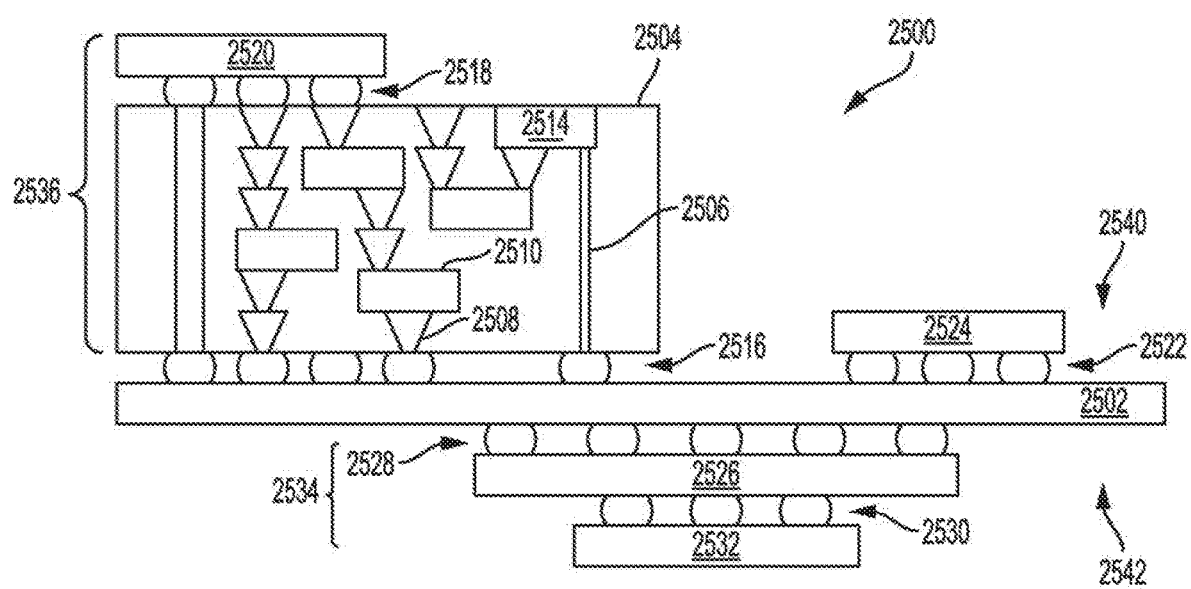
FIG. 25 is a cross-sectional side view of an IC device assembly that may include the stacked channel structure of FIG. 1, in accordance with various embodiments.

FIG. 25 is a cross-sectional side view of an IC device assembly 2500 that may include a stacked channel structure 100, in accordance with any of the embodiments disclosed herein. The IC device assembly 2500 includes a number of components disposed on a circuit board 2502 (which may be, for example, a motherboard). The IC device assembly 2500 includes components disposed on a first face 2540 of the circuit board 2502 and an opposing second face 2542 of the circuit board 2502; generally, components may be disposed on one or both faces 2540 and 2542.

In some embodiments, the circuit board 2502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2502. In other embodiments, the circuit board 2502 may be a non-PCB substrate.

The IC device assembly 2500 illustrated in FIG. 25 includes a package-on-interposer structure 2536 coupled to the first face 2540 of the circuit board 2502 by coupling components 2516. The coupling components 2516 may electrically and mechanically couple the package-on-interposer structure 2536 to the circuit board 2502, and may include solder balls (as shown in FIG. 25), male and female portions of a socket, an adhesive, an underfill material, and/or any other suitable electrical and/or mechanical coupling structure.

The package-on-interposer structure 2536 may include an IC package 2520 coupled to an interposer 2504 by coupling components 2518. The coupling components 2518 may take any suitable form for the application, such as the forms discussed above with reference to the coupling components 2516. Although a single IC package 2520 is shown in FIG. 25, multiple IC packages may be coupled to the interposer 2504; indeed, additional interposers may be coupled to the interposer 2504. The interposer 2504 may provide an intervening substrate used to bridge the circuit board 2502 and the IC package 2520. The IC package 2520 may be or include, for example, a die (the die 2302 of FIG. 23B), an IC device (e.g., the IC device 2400 of FIG. 24, the vertically integrated single fin elements of FIG. 22, or any of the circuit elements discussed above with reference to FIGS. 2-8), or any other suitable component. Generally, the interposer 2504 may spread a connection to a wider pitch or to reroute a connection to a different connection. For example, the interposer 2504 may couple the IC package 2520 (e.g., a die) to a ball grid array (BGA) of the coupling components 2516 for coupling to the circuit board 2502. In the embodiment illustrated in FIG. 25, the IC package 2520 and the circuit board 2502 are attached to opposing sides of the interposer 2504; in other embodiments, the IC package 2520 and the circuit board 2502 may be attached to a same side of the interposer 2504. In some embodiments, three or more components may be interconnected by way of the interposer 2504.

The interposer 2504 may be formed of an epoxy resin, a fiberglass-reinforced epoxy resin, a ceramic material, or a polymer material such as polyimide. In some implementations, the interposer 2504 may be formed of alternate rigid or flexible materials that may include the same materials described above for use in a semiconductor substrate, such as silicon, germanium, and other group III-V and group IV materials. The interposer 2504 may include metal interconnects 2508 and vias 2510, including but not limited to through-silicon vias (TSVs) 2506. The interposer 2504 may further include embedded devices 2514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 2504. The package-on-interposer structure 2536 may take the form of any of the package-on-interposer structures known in the art.

The IC assembly 2500 may include an IC package 2524 coupled to the first face 2540 of the circuit board 2502 by coupling components 2522. The coupling components 2522 may take the form of any of the embodiments discussed above with reference to the coupling components 2516, and the IC package 2524 may take the form of any of the embodiments discussed above with reference to the IC package 2520.

The IC device assembly 2500 illustrated in FIG. 25 includes a package-on-package structure 2534 coupled to the second face 2542 of the circuit board 2502 by coupling components 2528. The package-on-package structure 2534 may include an IC package 2526 and an IC package 2532 coupled together by coupling components 2530 such that the IC package 2526 is disposed between the circuit board 2502 and the IC package 2532. The coupling components 2528 and 2530 may take the form of any of the embodiments of the coupling components 2516 discussed above, and the IC packages 2526 and 2532 may take the form of any of the embodiments of the IC package 2520 discussed above. The package-on-package structure 2534 may be configured in accordance with any of the package-on-package structures known in the art.

Figure 26:
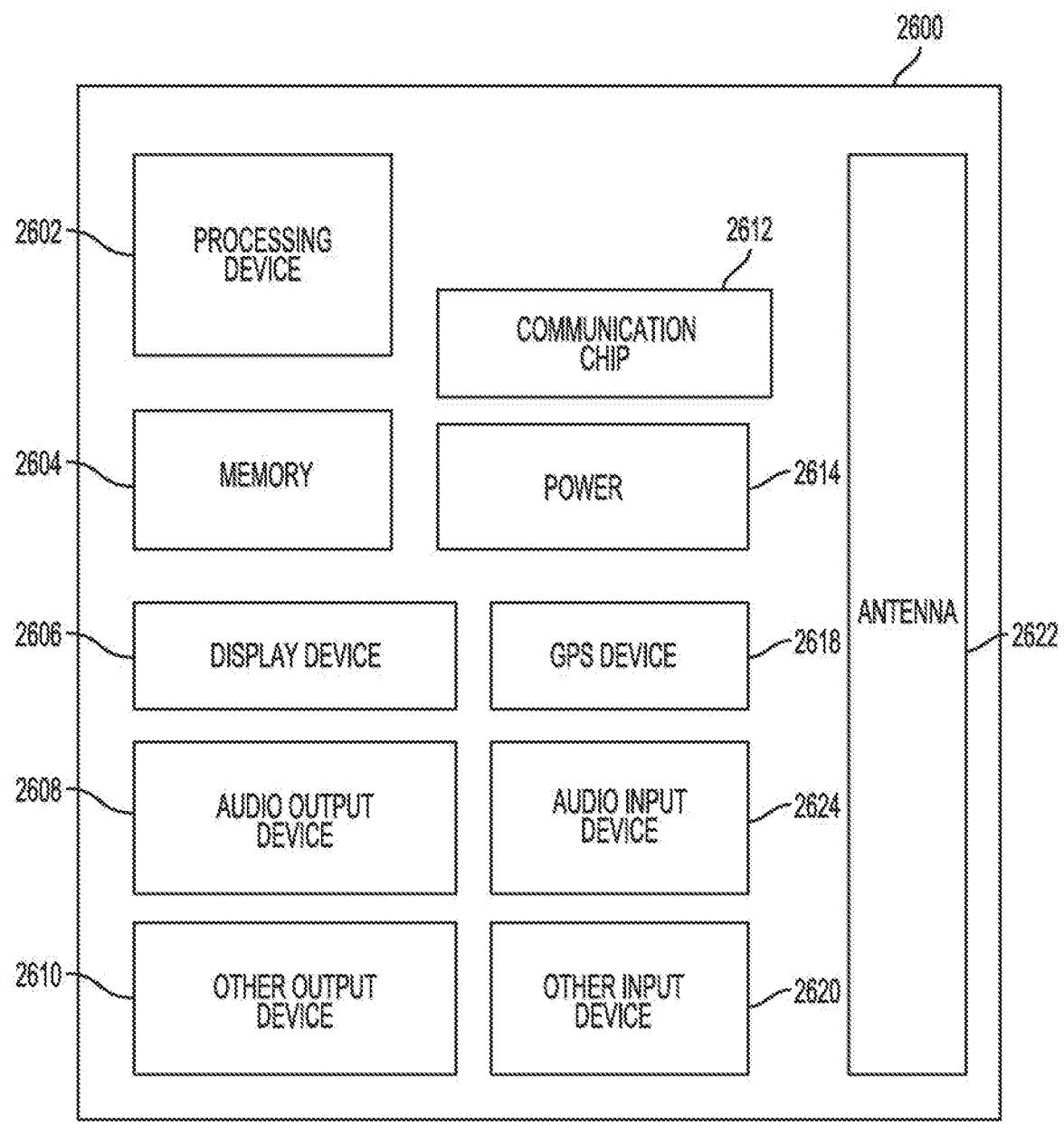
FIG. 26 is a block diagram of an example computing device that may include the stacked channel structure of FIG. 1, in accordance with various embodiments.

FIG. 26 is a block diagram of an example computing device 2600 that may include a stacked channel structure 100 in accordance with the teachings of the present disclosure. In particular, any of the components of the computing device 2600 that may include stacked transistors may include the stacked channel structure 100 (e.g., in a circuit element, a vertically integrated arrangement of single fin elements, an IC device 2400 (FIG. 24), and/or in a die 2302 (FIG. 23B)). A number of components are illustrated in FIG. 26 as included in the computing device 2600, but any one or more of these components may be omitted or duplicated, as suitable for the application. In some embodiments, some or all of the components included in the computing device 2600 may be attached to one or more motherboards. In some embodiments, some or all of these components are fabricated onto a single system-on-a-chip (SoC) die.

Additionally, in various embodiments, the computing device 2600 may not include one or more of the components illustrated in FIG. 26, but the computing device 2600 may include interface circuitry for coupling to the one or more components. For example, the computing device 2600 may not include a display device 2606, but may include display device interface circuitry (e.g., a connector and driver circuitry) to which a display device 2606 may be coupled. In another set of examples, the computing device 2600 may not include an audio input device 2624 or an audio output device 2608, but may include audio input or output device interface circuitry (e.g., connectors and supporting circuitry) to which an audio input device 2624 or audio output device 2608 may be coupled. Any one or more of the components of the computing device 2600 may be included in one or more IC devices that may include an embodiment of the stacked channel structure 100 disclosed herein.

The computing device 2600 may include a processing device 2602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2602 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2600 may include a memory 2604, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 2604 may include memory that shares a die with the processing device 2602. This memory may be used as cache memory and may include embedded DRAM (eDRAM) or STT-MRAM. The processing device 2602 and/or the memory 2604 may include one or more of the stacked channel structures 100.

In some embodiments, the computing device 2600 may include a communication chip 2612 (e.g., one or more communication chips). For example, the communication chip 2612 may be configured for managing wireless communications for the transfer of data to and from the computing device 2600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 2612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2612 may operate in accordance with other wireless protocols in other embodiments. The computing device 2600 may include an antenna 2622 to facilitate wireless communications and/or to receive other wireless communications (such as AM or FM radio transmissions).

In some embodiments, the communication chip 2612 may manage wired communications, such as electrical, optical, or any other suitable communication protocols (e.g., the Ethernet). As noted above, the communication chip 2612 may include multiple communication chips. For instance, a first communication chip 2612 may be dedicated to shorter-range wireless communications such as Wi-Fi or Bluetooth, and a second communication chip 2612 may be dedicated to longer-range wireless communications such as GPS, EDGE, GPRS, CDMA, WiMAX, LTE, EV-DO, or others. In some embodiments, a first communication chip 2612 may be dedicated to wireless communications, and a second communication chip 2612 may be dedicated to wired communications. The communication chip 2612 may include one or more of the stacked channel structures 100.

The computing device 2600 may include battery/power circuitry 2614. The battery/power circuitry 2614 may include one or more energy storage devices (e.g., batteries or capacitors) and/or circuitry for coupling components of the computing device 2600 to an energy source separate from the computing device 2600 (e.g., AC line power).

The computing device 2600 may include a display device 2606 (or corresponding interface circuitry, as discussed above). The display device 2606 may include any visual indicators, such as a heads-up display, a computer monitor, a projector, a touchscreen display, a liquid crystal display (LCD), a light-emitting diode display, or a flat panel display, for example.

The computing device 2600 may include an audio output device 2608 (or corresponding interface circuitry, as discussed above). The audio output device 2608 may include any device that generates an audible indicator, such as speakers, headsets, or earbuds, for example.

The computing device 2600 may include an audio input device 2624 (or corresponding interface circuitry, as discussed above). The audio input device 2624 may include any device that generates a signal representative of a sound, such as microphones, microphone arrays, or digital instruments (e.g., instruments having a musical instrument digital interface (MIDI) output).

The computing device 2600 may include a global positioning system (GPS) device 2618 (or corresponding interface circuitry, as discussed above). The GPS device 2618 may be in communication with a satellite-based system and may receive a location of the computing device 2600, as known in the art.

The computing device 2600 may include an other output device 2610 (or corresponding interface circuitry, as discussed above). Examples of the other output device 2610 may include an audio codec, a video codec, a printer, a wired or wireless transmitter for providing information to other devices, or an additional storage device.

The computing device 2600 may include an other input device 2620 (or corresponding interface circuitry, as discussed above). Examples of the other input device 2620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2600 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2600 may be any other electronic device that processes data.

The following paragraphs provide various examples of the embodiments disclosed herein.

Example 1 is a stacked channel structure, including: a semiconductor substrate having a substrate lattice constant; a fin extending away from the semiconductor substrate, the fin having an upper region and a lower region; a first channel of a first transistor, wherein the first channel is disposed in the lower region, the first channel has a first lattice constant, and the first lattice constant is different from the substrate lattice constant; and a second channel of a second transistor, wherein the second channel is disposed in the upper region, the second channel has a second lattice constant, and the second lattice constant is different from the substrate lattice constant.

Example 2 may include the subject matter of Example 1, and may further include: a first insulator material disposed between the first channel and the semiconductor substrate; and a second insulator material disposed between the first channel and the second channel.

Example 3 may include the subject matter of Example 2, and may further specify that the first insulator material or the second insulator material includes a crystalline insulator.

Example 4 may include the subject matter of Example 3, and may further specify that the first insulator material or the second insulator material includes yttria stabilized zirconia (YSZ).

Example 5 may include the subject matter of Example 2, and may further specify that the first insulator material or the second insulator material includes a nitride or an oxide.

Example 6 may include the subject matter of any of Examples 2-5, and may further specify that the first insulator material has a thickness between the first channel and the semiconductor substrate, and the thickness is less than 20 nm.

Example 7 may include the subject matter of any of Examples 2-6, and may further specify that the second insulator material has a thickness between the first channel and the second channel, and the thickness is less than 20 nm.

Example 8 may include the subject matter of any of Examples 1-7, and may further specify that the first lattice constant is greater than the substrate lattice constant.

Example 9 may include the subject matter of Example 8, and may further specify that the second lattice constant is greater than the substrate lattice constant.

Example 10 may include the subject matter of Example 8, and may further specify that the second lattice constant is less than the substrate lattice constant.

Example 11 may include the subject matter of Example 10, and may further specify that the first channel includes $Si_{1-x}Ge_x$, the second channel includes $Si_{1-y}Ge_y$, and x is greater than y.

Example 12 may include the subject matter of Example 10, and may further specify that the first channel includes $Ge_{1-x}Sn_x$, the second channel includes $Ge_{1-y}Sn_y$, and x is greater than y.

Example 13 may include the subject matter of Example 10, and may further specify that the first channel includes $Si_{1-x}Sn_x$, the second channel includes $Si_{1-y}Sn_y$, and x is greater than y.

Example 14 may include the subject matter of any of Examples 1-7, and may further specify that the first lattice constant is less than the substrate lattice constant.

Example 15 may include the subject matter of Example 14, and may further specify that the second lattice constant is greater than the substrate lattice constant.

Example 16 may include the subject matter of any of Examples 14-15, and may further specify that the first channel includes $Si_{1-x}Ge_x$, the second channel includes $Si_{1-y}Ge_y$, and x is less than y.

Example 17 may include the subject matter of any of Examples 14-15, and may further specify that the first channel includes $Ge_{1-x}Sn_x$, the second channel includes $Ge_{1-y}Sn_y$, and x is less than y.

Example 18 may include the subject matter of any of Examples 14-15, and may further specify that the first channel includes $Si_{1-x}Sn_x$, the second channel includes $Si_{1-y}Sn_y$, and x is less than y.

Example 19 may include the subject matter of Example 14, and may further specify that the second lattice constant is less than the substrate lattice constant.

Example 20 may include the subject matter of any of Examples 1-19, and may further specify that the semiconductor substrate includes relaxed silicon germanium (SiGe).

Example 21 may include the subject matter of any of Examples 1-19, and may further specify that the semiconductor substrate includes indium gallium arsenide (InGaAs), indium arsenide (InP), indium phosphide (InP), gallium arsenide (GaAs), or aluminum gallium arsenide (AlGaAs).

Example 22 may include the subject matter of any of Examples 1-19, and may further specify that the semiconductor substrate includes silicon.

Example 23 is a circuit element, including: a semiconductor substrate; a fin extending away from the semiconductor substrate, the fin having an upper region and a lower region; a first strained channel of a first transistor, and may further specify that the first strained channel is disposed in the lower region; a second strained channel of a second transistor, and may further specify that the second strained channel is disposed in the upper region, and the first strained channel is disposed between the second strained channel and the semiconductor substrate; and a conductive pathway disposed between the first and second transistors.

Example 24 may include the subject matter of Example 23, and may further specify that lattice constants of each of the first and second strained channels are different from a lattice constant of the semiconductor substrate.

Example 25 may include the subject matter of any of Examples 23-24, and may further specify that at least one of the first and second transistors is an n-type metal oxide semiconductor (NMOS) device, and the strained channel associated with that at least one transistor is under tension.

Example 26 may include the subject matter of Example 25, and may further specify that the tension has a magnitude greater than or equal to 250 MPa.

Example 27 may include the subject matter of any of Examples 23-24, and may further specify that at least one of the first and second transistors is a p-type metal oxide semiconductor (PMOS) device, and the strained channel associated with the PMOS device is under compression.

Example 28 may include the subject matter of Example 27, and may further specify that the compression has a magnitude greater than or equal to 250 MPa.

Example 29 may include the subject matter of any of Examples 27-28, and may further specify that the strained channel associated with the PMOS device is bordered by source/drain (S/D) regions formed by implanting or in-diffusing a dopant into the fin.

Example 30 may include the subject matter of any of Examples 23-29, and may further specify that the conductive pathway couples a source/drain (S/D) region of the first transistor to an S/D region of the second transistor, and wherein the S/D region of the second transistor is disposed between the S/D region of the first transistor and the semiconductor substrate.

Example 31 may include the subject matter of Example 30, and may further specify that the first transistor and the second transistor have different conductivity types.

Example 32 may include the subject matter of any of Examples 23-31, and may further specify that the semiconductor substrate includes relaxed silicon germanium (SiGe).

Example 33 is a method of manufacturing a stacked channel structure, including: providing a semiconductor substrate having a substrate lattice constant; providing a first intermediate layer on the semiconductor substrate; providing a first channel material on the first intermediate layer, the first channel material having a first lattice constant different from the substrate lattice constant; providing a second intermediate layer on the first channel material; providing a second channel material on the second intermediate layer, the second channel material having a second lattice constant different from the substrate lattice constant; and forming a fin extending away from the semiconductor substrate, and may further specify that the first channel material is disposed in a lower region of the fin and the second channel material is disposed in an upper region of the fin.

Example 34 may include the subject matter of Example 33, and may further specify that the first channel material includes silicon germanium (SiGe), and the first intermediate layer or the second intermediate layer is a sacrificial SiGe layer having a germanium content greater than a germanium content of the first channel material.

Example 35 may include the subject matter of Example 34, and may further include selectively removing a portion of the sacrificial SiGe layer.

Example 36 may include the subject matter of Example 35, and may further include, after selectively removing the portion of the sacrificial SiGe layer, providing a nitride or oxide in place of the portion of the sacrificial SiGe layer.

Example 37 may include the subject matter of Example 33, and may further specify that the second channel material includes silicon germanium (SiGe), and the second intermediate layer is a sacrificial SiGe layer having a germanium content greater than a germanium content of the second channel material.

Example 38 may include the subject matter of Example 33, and may further specify that the first intermediate layer or the second intermediate layer includes a crystalline insulator.

Example 39 may include the subject matter of Example 38, and may further specify that the crystalline insulator includes yttria stabilized zirconia (YSZ).

Example 40 may include the subject matter of Example 33, and may further specify that the first intermediate layer, the first channel material, the second intermediate layer, and the second channel material are provided by epitaxy.

Example 41 may include the subject matter of Example 33, and may further specify that the second intermediate layer is a marker layer.

Example 42 may include the subject matter of Example 41, and may further include: etching the second channel material; and after etching the second channel material, forming source/drain (S/D) regions by implanting or in-diffusing a dopant into the second channel material.

Example 43 is a computing device, including: a memory device; and a processing device, coupled to the memory device, and may further specify that the processing device includes a circuit element that includes: a semiconductor substrate, a fin extending away from the semiconductor substrate, the fin having an upper region and a lower region, a first strained channel of a first transistor, wherein the first strained channel is disposed in the lower region, a second strained channel of a second transistor, wherein the second strained channel is disposed in the upper region, and the first strained channel is disposed between the second strained channel and the semiconductor substrate, and a conductive pathway disposed between the first and second transistors.

Example 44 may include the subject matter of Example 43, and may further include: an antenna; a communication chip; a display; and a battery.

Example 45 may include the subject matter of any of Examples 43, and may further include a graphics processing unit, a power amplifier, a global positioning system receiver, or a voltage regulator.

Example 46 may include the subject matter of any of Examples 43-45, and may further specify that the semiconductor substrate includes relaxed silicon germanium (SiGe).

Example 47 may include the subject matter of any of Examples 43-46, and may further specify that the first transistor is a p-type metal oxide semiconductor (PMOS) device, and the first strained channel is under compression.

Example 48 may include the subject matter of any of Examples 43-46, and may further specify that the first transistor is an n-type metal oxide semiconductor (NMOS) device, and the first strained channel is under tension.

The invention claimed is:

1. A stacked channel structure, comprising:
a semiconductor substrate having a substrate lattice constant;
a fin extending away from the semiconductor substrate, the fin having an upper region and a lower region;
a first channel material of a first transistor, wherein the first channel material is in the lower region, the first channel material has a first lattice constant, and the first lattice constant is different from the substrate lattice constant;
a second channel material of a second transistor, wherein the second channel material is in the upper region, the second channel material has a second lattice constant, the second lattice constant is different from the substrate lattice constant;
source/drain (S/D) regions, wherein the S/D regions include a dopant in the second channel material;
a first intermediate material between the first channel material and the semiconductor substrate; and
a second intermediate material between the first channel material and the second channel material;
wherein the first intermediate material or the second intermediate material includes yttria stabilized zirconia (YSZ).

2. The stacked channel structure of claim 1, wherein the first lattice constant is greater than the substrate lattice constant.

3. The stacked channel structure of claim 2, wherein the second lattice constant is greater than the substrate lattice constant.

4. The stacked channel structure of claim 2, wherein the second lattice constant is less than the substrate lattice constant.

5. The stacked channel structure of claim 1, wherein the first lattice constant is less than the substrate lattice constant.

6. The stacked channel structure of claim 5, wherein the second lattice constant is greater than the substrate lattice constant.

7. The stacked channel structure of claim 5, wherein the second lattice constant is less than the substrate lattice constant.

8. The stacked channel structure of claim 1, wherein the first intermediate material has a thickness between the first channel material and the semiconductor substrate, and the thickness is less than 20 nm.

9. The stacked channel structure of claim 1, wherein the second intermediate material has a thickness between the first channel material and the second channel material, and the thickness is less than 20 nm.

10. The stacked channel structure of claim 1, wherein the semiconductor substrate includes relaxed silicon germanium (SiGe).

11. The stacked channel structure of claim 1, wherein at least one of the first and second transistors is an n-type metal oxide semiconductor (NMOS) device, the channel material associated with that at least one transistor is under tension, and the tension has a magnitude greater than or equal to 250 MPa.

12. The stacked channel structure of claim 1, wherein at least one of the first and second transistors is a p-type metal oxide semiconductor (PMOS) device, the channel material associated with the PMOS device is under compression, and the compression has a magnitude greater than or equal to 250 MPa.

13. The stacked channel structure of claim 1, wherein the dopant in the S/D regions is an implanted dopant or an in-diffused dopant.

14. An electronic component, comprising:
a circuit element that includes:
a semiconductor substrate;
a fin extending away from the semiconductor substrate, the fin having an upper region and a lower region;
a first strained channel material of a first transistor, wherein the first strained channel material is in the lower region;
a first intermediate material between the first strained channel material and the semiconductor substrate;
a second strained channel material of a second transistor, wherein the second strained channel material is in the upper region, and the first strained channel material is between the second strained channel material and the semiconductor substrate;
a second intermediate material between the first strained channel material and the second strained channel material;
source/drain (S/D) regions, wherein the S/D regions include a dopant in the second strained channel material; and
a conductive pathway between the first and second transistors;
wherein (1) at least one of the first and second transistors is an n-type metal oxide semiconductor (NMOS) device, the strained channel material associated with that at least one transistor is under tension, and the tension has a magnitude greater than or equal to 250 MPa, or (2) at least one of the first and second transistors is a p-type metal oxide semiconductor (PMOS) device, the strained channel material associated with that at least one transistor is under compression, and the compression has a magnitude greater than or equal to 250 MPa.

15. The electronic component of claim 14, wherein the circuit element is included in a processing device of the electronic component, and the electronic component further includes a memory device coupled to the processing device.

16. The electronic component of claim 15, wherein:
the first intermediate material or the second intermediate material includes a crystalline insulator.

17. The electronic component of claim 16, wherein the first intermediate material or the second intermediate material includes yttria stabilized zirconia (YSZ).

18. The electronic component of claim 15, further comprising:
an antenna;
a communication chip;
a display; and
a battery.

19. The electronic component of claim 15, further comprising a graphics processing unit, a power amplifier, a global positioning system receiver, or a voltage regulator.

20. The electronic component of claim 15, wherein the dopant in the S/D regions is an implanted dopant or an in-diffused dopant.

21. The electronic component of claim 14, wherein:
the first intermediate material or the second intermediate material includes a crystalline insulator.

22. The electronic component of claim 21, wherein the first intermediate material or the second intermediate material includes yttria stabilized zirconia (YSZ).

23. The electronic component of claim 14, wherein the dopant in the S/D regions is an implanted dopant or an in-diffused dopant.

24. A method of manufacturing a stacked channel structure, comprising:
providing a semiconductor substrate having a substrate lattice constant;
providing a first intermediate layer on the semiconductor substrate;
providing a first channel material on the first intermediate layer, the first channel material having a first lattice constant different from the substrate lattice constant;
providing a second intermediate layer on the first channel material;
providing a second channel material on the second intermediate layer, the second channel material having a second lattice constant different from the substrate lattice constant;
forming a fin extending away from the semiconductor substrate, wherein the first channel material is in a lower region of the fin and the second channel material is in an upper region of the fin;
etching the second channel material; and
after etching the second channel material, forming source/drain (S/D) regions by implanting or in-diffusing a dopant into the second channel material.

25. The method of claim 24, wherein the second intermediate layer is a marker layer.

* * * * *